(12) United States Patent
Baiocco et al.

(10) Patent No.: US 9,874,693 B2
(45) Date of Patent: Jan. 23, 2018

(54) METHOD AND STRUCTURE FOR INTEGRATING PHOTONICS WITH CMOS

(71) Applicants: Christopher Baiocco, Newburgh, NY (US); Douglas Coolbaugh, Highland, NY (US); Gerald Leake, Clifton Park, NY (US)

(72) Inventors: Christopher Baiocco, Newburgh, NY (US); Douglas Coolbaugh, Highland, NY (US); Gerald Leake, Clifton Park, NY (US)

(73) Assignee: The Research Foundation for the State University of New York, Albany, NY (US)

( * ) Notice: Subject to any disclaimer, the term of this patent is extended or adjusted under 35 U.S.C. 154(b) by 0 days.

(21) Appl. No.: 14/735,622

(22) Filed: Jun. 10, 2015

(65) Prior Publication Data
US 2016/0363729 A1    Dec. 15, 2016

(51) Int. Cl.
*G02B 6/12*    (2006.01)
*G02B 6/13*    (2006.01)
(Continued)

(52) U.S. Cl.
CPC .......... *G02B 6/13* (2013.01); *G02B 6/12004* (2013.01); *G02B 6/1347* (2013.01); *H01L 21/762* (2013.01); *G02B 6/124* (2013.01); *G02B 6/136* (2013.01); *G02B 2006/121* (2013.01); *G02B 2006/12169* (2013.01); *H01L 21/26506* (2013.01); *H01L 29/665* (2013.01); *H01L 29/6656* (2013.01); *H01L 29/6659* (2013.01); *H01L 29/66537* (2013.01); *H01L 29/7833* (2013.01)

(58) Field of Classification Search
None
See application file for complete search history.

(56) References Cited

U.S. PATENT DOCUMENTS 5,835,141 A    11/1998    Ackland et al.
5,951,627 A    9/1999    Kiamilev et al.
(Continued)

FOREIGN PATENT DOCUMENTS

KR    1020140065285    5/2014
KR    1020140142423    12/2014
WO    WO 2014107504 A    7/2014

OTHER PUBLICATIONS

International Search Report for International Application No. PCT/US2016/035022, dated Aug. 19, 2016.
(Continued)

*Primary Examiner* — Sung Pak
(74) *Attorney, Agent, or Firm* — Heslin Rothenberg Farley & Mesiti, P.C.; George S. Blasiak, Esq.

(57) ABSTRACT

A semiconductor structure can include an active device FET region having a FET and a photonics region having a photonic device including a waveguide. A semiconductor structure can include an active device FET region having a FET and a trench isolation region having a photonic device that includes a waveguide. A method can include forming a FET at an active device FET region of a semiconductor structure. A method can include forming a photonic device at a trench isolation region of a semiconductor structure.

34 Claims, 13 Drawing Sheets

(51) Int. Cl.
*G02B 6/134* (2006.01)
*H01L 21/762* (2006.01)
*G02B 6/124* (2006.01)
*G02B 6/136* (2006.01)
*H01L 21/265* (2006.01)
*H01L 29/66* (2006.01)
*H01L 29/78* (2006.01)

(56) References Cited

U.S. PATENT DOCUMENTS

| | | |
|---|---|---|
| 6,266,712 B1 | 7/2001 | Henrichs |
| 6,423,560 B1 | 7/2002 | Trezza et al. |
| 6,504,977 B1 | 1/2003 | Krishnamoorthy |
| 6,552,338 B1 | 4/2003 | Doyle |
| 6,825,455 B1 | 11/2004 | Schwarte |
| 6,888,141 B2 | 5/2005 | Carr |
| 7,072,534 B2 | 7/2006 | Bjorkman et al. |
| 7,110,629 B2 | 9/2006 | Bjorkman et al. |
| 7,184,625 B2 | 2/2007 | Gunn, III et al. |
| 7,184,627 B1 | 2/2007 | Gunn, III et al. |
| 7,194,166 B1 | 3/2007 | Gunn, III |
| 7,245,803 B2 | 7/2007 | Gunn, III |
| 7,251,386 B1 | 7/2007 | Dickinson et al. |
| 7,259,031 B1 | 8/2007 | Dickinson et al. |
| 7,260,289 B1 | 8/2007 | Gunn, III et al. |
| 7,260,293 B1 | 8/2007 | Gunn, III et al. |
| 7,260,422 B2 | 8/2007 | Knoedgen |
| 7,262,117 B1 | 8/2007 | Gunn, III et al. |
| 7,298,945 B2 | 11/2007 | Gunn, III et al. |
| 7,309,878 B1 | 12/2007 | Kwiatkowski et al. |
| 7,321,713 B2 | 1/2008 | Akiyama et al. |
| 7,407,896 B2 | 8/2008 | Negro et al. |
| 7,408,237 B2 | 8/2008 | Mouli |
| 7,453,132 B1 | 11/2008 | Gunn, III et al. |
| 7,539,418 B1 | 5/2009 | Krishnamoorthy et al. |
| 7,603,016 B1 | 10/2009 | Soref |
| 7,613,369 B2 | 11/2009 | Witzens et al. |
| 7,616,904 B1 | 11/2009 | Gunn, III et al. |
| 7,803,707 B2 | 9/2010 | Jin et al. |
| 7,826,688 B1 | 11/2010 | Sadagopan et al. |
| 7,847,353 B2 | 12/2010 | Hill et al. |
| 7,881,575 B2 | 2/2011 | Mekis |
| 7,907,848 B1 | 3/2011 | Soref |
| 8,014,676 B2 | 9/2011 | Chen et al. |
| 8,081,794 B2 | 12/2011 | Stiegler |
| 8,093,139 B2 | 1/2012 | Krivoshlykov |
| 8,110,823 B2 | 2/2012 | Bowers |
| 8,183,516 B2 | 5/2012 | Augusto |
| 8,213,751 B1 | 7/2012 | Ho et al. |
| 8,222,084 B2 | 7/2012 | Dallesasse et al. |
| 8,280,207 B2 | 10/2012 | Pinguet et al. |
| 8,330,090 B2 | 12/2012 | Agarwal |
| 8,355,117 B2 | 1/2013 | Niclass |
| 8,408,464 B2 | 4/2013 | Zhu et al. |
| 8,433,162 B2 | 4/2013 | Pinguet et al. |
| 8,440,994 B2 | 5/2013 | Kastalsky |
| 8,442,368 B1 | 5/2013 | Reano et al. |
| 8,471,639 B2 | 6/2013 | Welch |
| 8,513,037 B2 | 8/2013 | Pomerene et al. |
| 8,630,326 B2 | 1/2014 | Krasulick et al. |
| 8,634,069 B2 | 1/2014 | Nakano et al. |
| 8,649,639 B2 | 2/2014 | Mekis et al. |
| 8,682,129 B2 | 3/2014 | Sandhu et al. |
| 8,722,464 B2 | 5/2014 | Dallesasse et al. |
| 8,754,711 B2 | 6/2014 | Welch |
| 8,765,536 B2 * | 7/2014 | Assefa ............ H01L 31/1136 257/E31.122 |
| 8,785,309 B2 | 7/2014 | Kastalsky |
| 8,787,417 B2 | 7/2014 | Baets et al. |
| 8,798,476 B2 | 8/2014 | Gloeckner et al. |
| 8,831,437 B2 | 9/2014 | Dobbelaere et al. |
| 8,854,624 B2 | 10/2014 | Pervez et al. |
| 8,859,394 B2 | 10/2014 | Dallesasse et al. |
| 8,885,987 B2 | 11/2014 | Augusto |
| 8,937,296 B2 | 1/2015 | Bowers |
| 8,948,223 B2 | 2/2015 | Chung |
| 8,963,169 B2 | 2/2015 | Augusto |
| 9,024,295 B2 | 5/2015 | Wang et al. |
| 9,034,724 B2 | 5/2015 | Meade et al. |
| 9,053,929 B1 | 6/2015 | Huff et al. |
| 9,091,827 B2 | 7/2015 | Verslegers et al. |
| 9,130,651 B2 | 9/2015 | Tabe |
| 9,140,914 B1 | 9/2015 | Ptasinski et al. |
| 9,237,211 B2 | 1/2016 | Tabe |
| 9,261,647 B1 | 2/2016 | Cox et al. |
| 9,263,621 B2 | 2/2016 | Vreman et al. |
| 9,274,272 B2 | 3/2016 | Sandhu et al. |
| 9,306,116 B2 | 4/2016 | El-Ghoroury et al. |
| 9,356,701 B2 | 5/2016 | Peterson et al. |
| 9,389,378 B2 | 7/2016 | Mack et al. |
| 9,391,708 B2 | 7/2016 | Fincato et al. |
| 9,417,389 B2 | 8/2016 | Pinguet et al. |
| 9,417,412 B2 | 8/2016 | Shastri et al. |
| 9,417,466 B2 | 8/2016 | Mekis et al. |
| 9,420,700 B2 | 8/2016 | Vreman et al. |
| 2001/0054741 A1* | 12/2001 | Segawa ............ H01L 21/76224 257/368 |
| 2003/0128398 A1 | 7/2003 | Pantigny |
| 2003/0143580 A1 | 7/2003 | Straus |
| 2003/0170613 A1 | 9/2003 | Straus |
| 2004/0067604 A1 | 4/2004 | Ouellet et al. |
| 2004/0092104 A1 | 5/2004 | Gunn et al. |
| 2004/0095214 A1 | 5/2004 | Marlow et al. |
| 2004/0146431 A1 | 7/2004 | Sxherer et al. |
| 2004/0195510 A1 | 10/2004 | Carr et al. |
| 2005/0061977 A1 | 3/2005 | Carr |
| 2005/0103854 A1 | 5/2005 | Zhu et al. |
| 2005/0109940 A1 | 5/2005 | Carr |
| 2005/0141808 A1 | 6/2005 | Cheben et al. |
| 2005/0255619 A1 | 11/2005 | Negro et al. |
| 2005/0263675 A1 | 12/2005 | Mouli |
| 2005/0271388 A1 | 12/2005 | Vogley |
| 2006/0050744 A1 | 3/2006 | Wong et al. |
| 2006/0088265 A1 | 4/2006 | Akiyama et al. |
| 2006/0140239 A1 | 6/2006 | Negro et al. |
| 2006/0206005 A1 | 9/2006 | Ou Yang et al. |
| 2006/0214250 A1 | 9/2006 | Mouli |
| 2006/0239612 A1 | 10/2006 | Dobbelaere et al. |
| 2006/0267123 A1 | 11/2006 | Wu |
| 2006/0274189 A1 | 12/2006 | Mouli |
| 2007/0032084 A1 | 2/2007 | Henley |
| 2007/0147726 A1 | 6/2007 | Kiesel et al. |
| 2007/0148760 A1 | 6/2007 | Kiesel et al. |
| 2007/0170417 A1 | 7/2007 | Bowers |
| 2007/0182949 A1 | 8/2007 | Niclass |
| 2007/0194213 A1 | 8/2007 | Augusto |
| 2007/0274630 A1 | 11/2007 | Ghiron et al. |
| 2008/0001139 A1 | 1/2008 | Augusto |
| 2008/0049975 A1 | 2/2008 | Stiegler |
| 2008/0095491 A1 | 4/2008 | Klootwijk et al. |
| 2008/0115817 A1 | 5/2008 | Defries |
| 2008/0193076 A1 | 8/2008 | Witzens et al. |
| 2008/0230752 A1 | 9/2008 | Bower et al. |
| 2008/0236652 A1 | 10/2008 | Defries et al. |
| 2009/0220189 A1 | 9/2009 | Kiesel et al. |
| 2009/0225799 A1 | 9/2009 | Hasegawa |
| 2009/0295712 A1 | 12/2009 | Ritzau |
| 2010/0059822 A1 | 3/2010 | Pinguet et al. |
| 2010/0166364 A1 | 7/2010 | Abad et al. |
| 2010/0203454 A1 | 8/2010 | Brongersma et al. |
| 2010/0279115 A1 | 11/2010 | Jin et al. |
| 2010/0295019 A1 | 11/2010 | Wang et al. |
| 2011/0039388 A1 | 2/2011 | Hill et al. |
| 2011/0118128 A1 | 5/2011 | Garcia Tello et al. |
| 2011/0198680 A1 | 8/2011 | Kim |
| 2011/0291164 A1 | 12/2011 | Canesta |
| 2011/0291564 A1 | 12/2011 | Huang |
| 2011/0305414 A1 | 12/2011 | Mekis et al. |
| 2011/0305416 A1 | 12/2011 | Mekia et al. |
| 2012/0004884 A1 | 1/2012 | Fillol et al. |
| 2012/0008658 A1 | 1/2012 | Chung, II |
| 2012/0025212 A1 | 2/2012 | Kouvetakis et al. |
| 2012/0132993 A1 | 5/2012 | Pinguet et al. |

(56) References Cited

U.S. PATENT DOCUMENTS

| | | |
|---|---|---|
| 2012/0135566 A1 | 5/2012 | Pinguet et al. |
| 2012/0154812 A1 | 6/2012 | Snyman |
| 2012/0170942 A1 | 7/2012 | Snyman |
| 2012/0206726 A1 | 8/2012 | Pervez et al. |
| 2012/0264256 A1 | 10/2012 | Dallesasse et al. |
| 2012/0288995 A1 | 11/2012 | El-Ghoroury et al. |
| 2012/0301149 A1 | 11/2012 | Pinguet et al. |
| 2013/0037857 A1 | 2/2013 | Von Kanel et al. |
| 2013/0070510 A1 | 3/2013 | Allot et al. |
| 2013/0171465 A1 | 7/2013 | Jin et al. |
| 2013/0181233 A1 | 7/2013 | Doany et al. |
| 2013/0189804 A1 | 7/2013 | Marchena |
| 2013/0202005 A1 | 8/2013 | Dutt |
| 2013/0240706 A1 | 9/2013 | Kiesel et al. |
| 2013/0334404 A1 | 12/2013 | Pinguet et al. |
| 2014/0010495 A1 | 1/2014 | Hill et al. |
| 2014/0027826 A1 | 1/2014 | Assefa et al. |
| 2014/0130570 A1 | 5/2014 | Lal et al. |
| 2014/0169740 A1 | 6/2014 | Verslegers et al. |
| 2014/0185981 A1 | 7/2014 | Assefa et al. |
| 2014/0193115 A1 | 7/2014 | Popovic |
| 2014/0197507 A1 | 7/2014 | Assefa et al. |
| 2014/0198815 A1 | 7/2014 | Chung |
| 2014/0209985 A1 | 7/2014 | Assefa et al. |
| 2014/0217485 A1 | 8/2014 | Assefa et al. |
| 2014/0217606 A1 | 8/2014 | Cho |
| 2014/0219604 A1 | 8/2014 | Hackler, Sr. et al. |
| 2014/0264400 A1 | 9/2014 | Lipson et al. |
| 2014/0270621 A1 | 9/2014 | Dutt et al. |
| 2014/0270629 A1 | 9/2014 | Dutt et al. |
| 2014/0270786 A1 | 9/2014 | Poddar et al. |
| 2014/0286647 A1 | 9/2014 | Ayazi et al. |
| 2014/0287575 A1 | 9/2014 | Kastalsky |
| 2014/0291489 A1 | 10/2014 | Welch |
| 2014/0334764 A1 | 11/2014 | Galland et al. |
| 2014/0342500 A1 | 11/2014 | Dallesasse et al. |
| 2015/0028192 A1 | 1/2015 | Pinguet et al. |
| 2015/0030298 A1 | 1/2015 | Augusto |
| 2015/0037044 A1 | 2/2015 | Peterson et al. |
| 2015/0054041 A1 | 2/2015 | Assefa et al. |
| 2015/0055911 A1 | 2/2015 | Bowers |
| 2015/0099318 A1 | 4/2015 | Krasulick et al. |
| 2015/0108506 A1 | 4/2015 | Zhang et al. |
| 2015/0111199 A1 | 4/2015 | Hart et al. |
| 2015/0123157 A1 | 5/2015 | Dallesasse et al. |
| 2015/0123230 A1 | 5/2015 | Jin et al. |
| 2015/0125110 A1 | 5/2015 | Anderson et al. |
| 2015/0125112 A1 | 5/2015 | Frankel et al. |
| 2015/0129836 A1 | 5/2015 | Augusto |
| 2015/0141268 A1 | 5/2015 | Rothberg et al. |
| 2015/0198775 A1 | 7/2015 | Sandhu |
| 2015/0215046 A1 | 7/2015 | Mekis et al. |
| 2015/0236791 A1 | 8/2015 | Nordholt et al. |
| 2015/0255241 A1 | 9/2015 | Bonam |
| 2015/0268417 A1 | 9/2015 | Assefa et al. |
| 2015/0270898 A1 | 9/2015 | Mekis et al. |
| 2015/0303229 A1 | 10/2015 | Assefa et al. |
| 2015/0309254 A1 | 10/2015 | Bowers |
| 2015/0316793 A1 | 11/2015 | Ayazi et al. |
| 2015/0320319 A1 | 11/2015 | Alfano et al. |
| 2015/0323450 A1 | 11/2015 | Lipson et al. |
| 2015/0331197 A1 | 11/2015 | Verslegers et al. |
| 2015/0338720 A1 | 11/2015 | Grenouillet et al. |
| 2015/0380905 A1 | 12/2015 | Hofrichter |
| 2015/0381273 A1 | 12/2015 | Gloeckner et al. |
| 2015/0381283 A1 | 12/2015 | Sahni et al. |
| 2016/0005700 A1 | 1/2016 | Rogers et al. |
| 2016/0012176 A1 | 1/2016 | Liu et al. |
| 2016/0033765 A1 | 2/2016 | Liu et al. |
| 2016/0036550 A1 | 2/2016 | Welch |
| 2016/0043264 A1 | 2/2016 | Song et al. |
| 2016/0070068 A1 | 3/2016 | Pomerene |
| 2016/0072651 A1 | 3/2016 | Welch |
| 2016/0103382 A1 | 4/2016 | Liboiron-Ladouceur et al. |
| 2016/0111407 A1 | 4/2016 | Krasulick |
| 2016/0116680 A1 | 4/2016 | Ling et al. |
| 2016/0119057 A1 | 4/2016 | Mekis et al. |
| 2016/0139058 A1 | 5/2016 | Patel |
| 2016/0155884 A1 | 6/2016 | Hon et al. |
| 2016/0156999 A1 | 6/2016 | Liboiron-Ladouceur et al. |
| 2016/0171149 A1 | 6/2016 | Alloatti |
| 2016/0181050 A1 | 6/2016 | Bonam |
| 2016/0182151 A1 | 6/2016 | Masini et al. |
| 2016/0211807 A1 | 7/2016 | Barabas et al. |
| 2016/0211818 A1 | 7/2016 | Barabas et al. |
| 2016/0211921 A1 | 7/2016 | Welch et al. |
| 2016/0246018 A1 | 8/2016 | Pinguet et al. |
| 2016/0276807 A1 | 9/2016 | Cai et al. |
| 2016/0277115 A1 | 9/2016 | Peterson et al. |

OTHER PUBLICATIONS

Written Opinion for International Application No. PCT/US2016/035022, dated Aug. 19, 2016.
U.S. Appl. No. 14/129,181, Dec. 29, 2015, Intel.
U.S. Appl. No. 13/868,477, Jan. 5, 2016, Global Foundries.

* cited by examiner

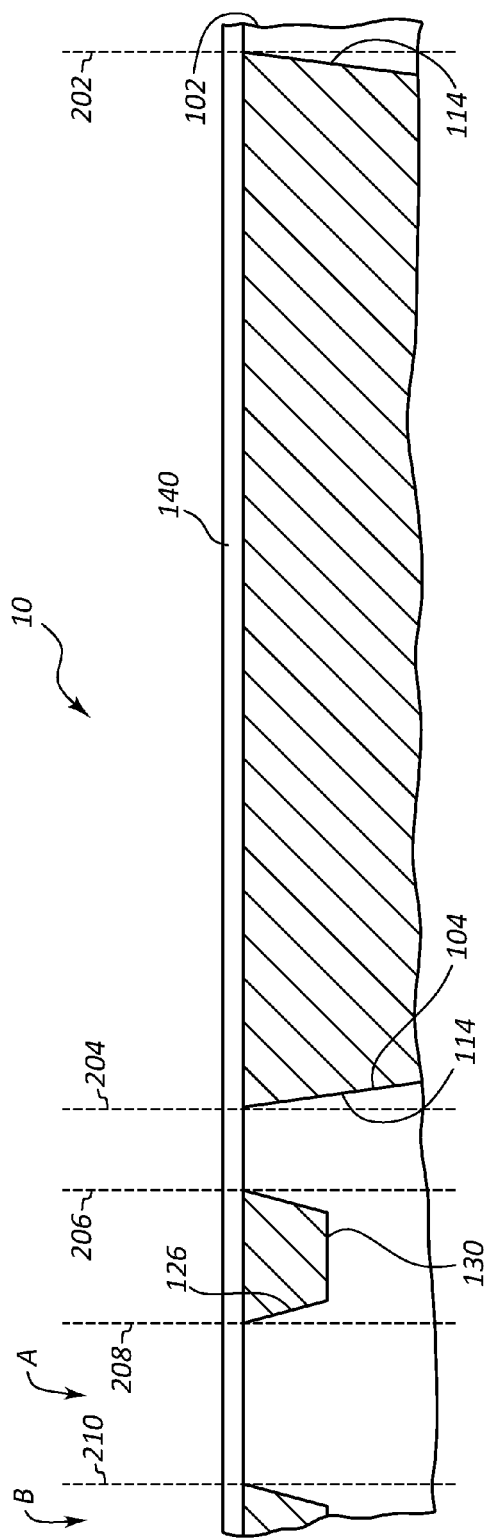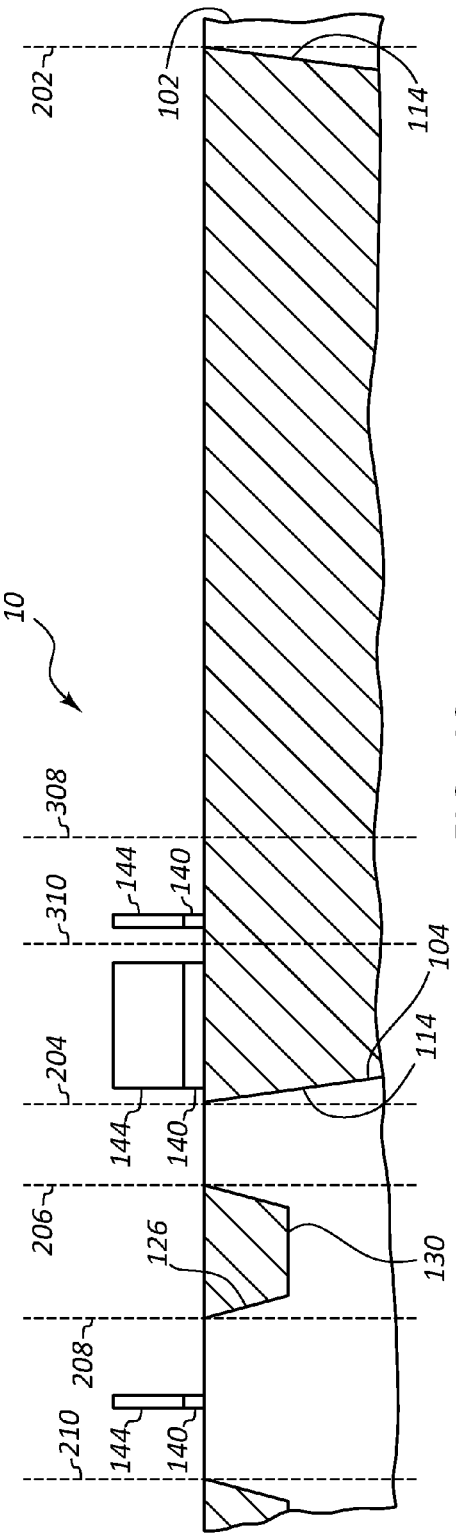

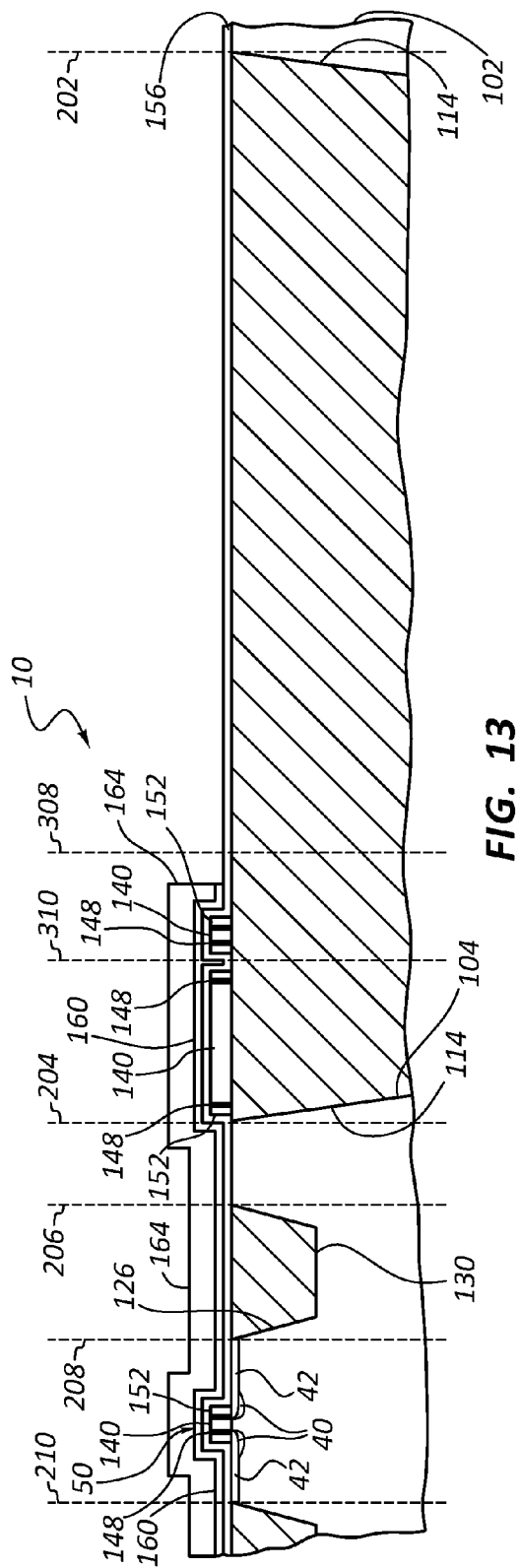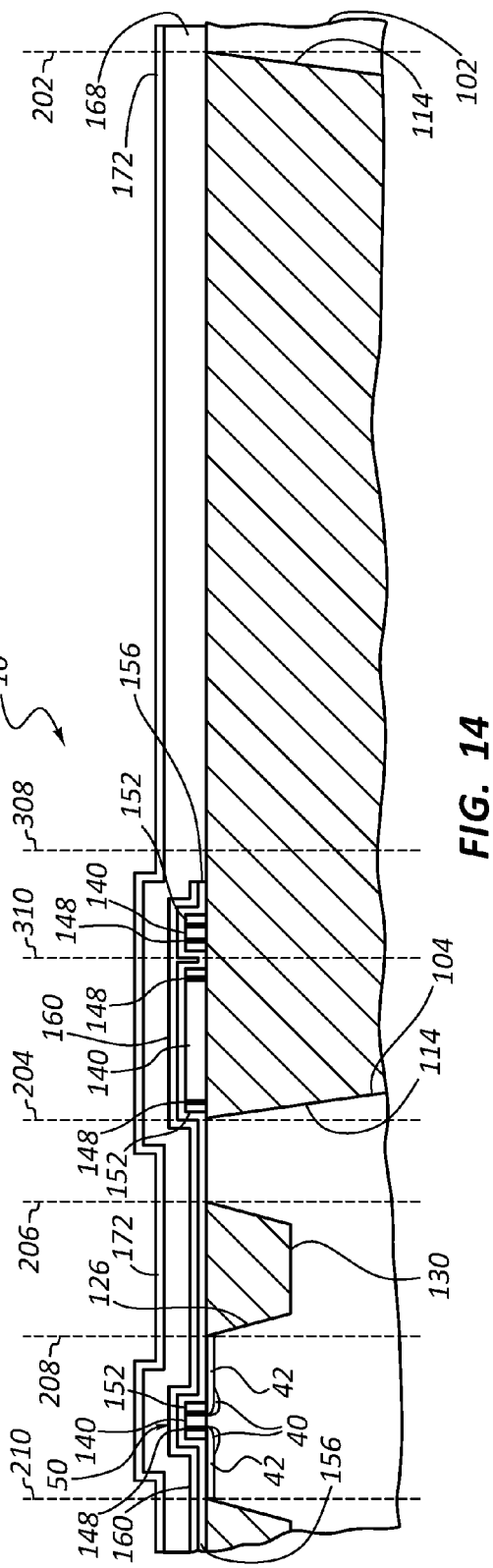

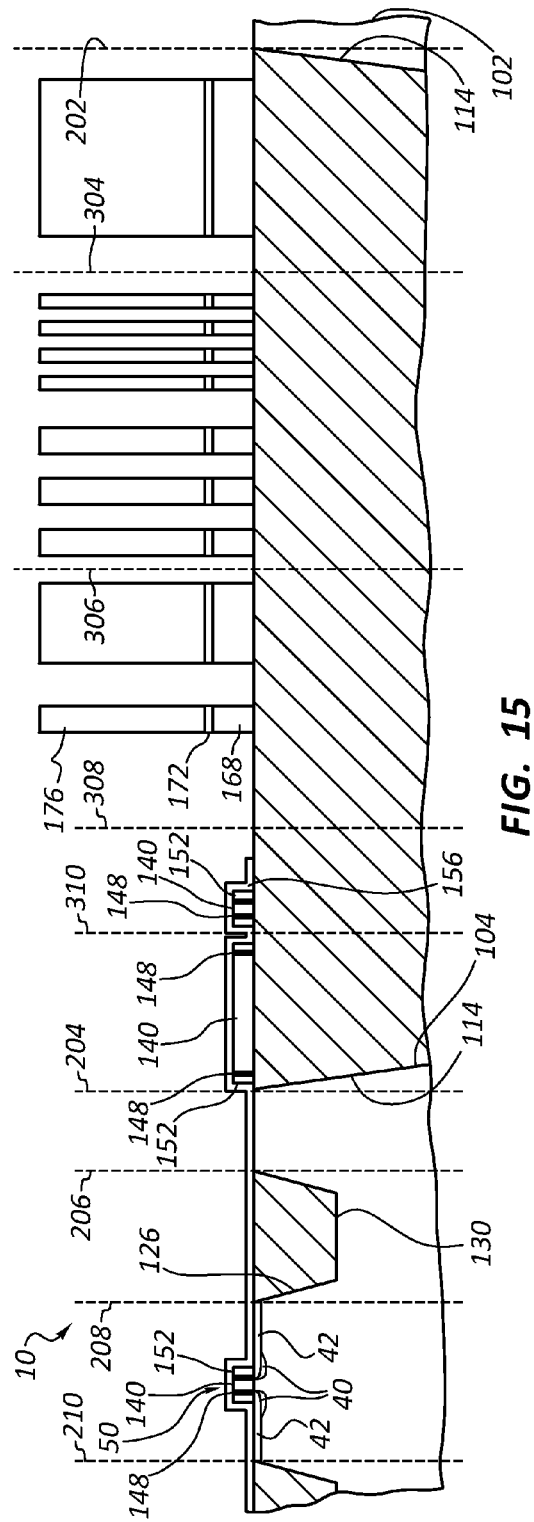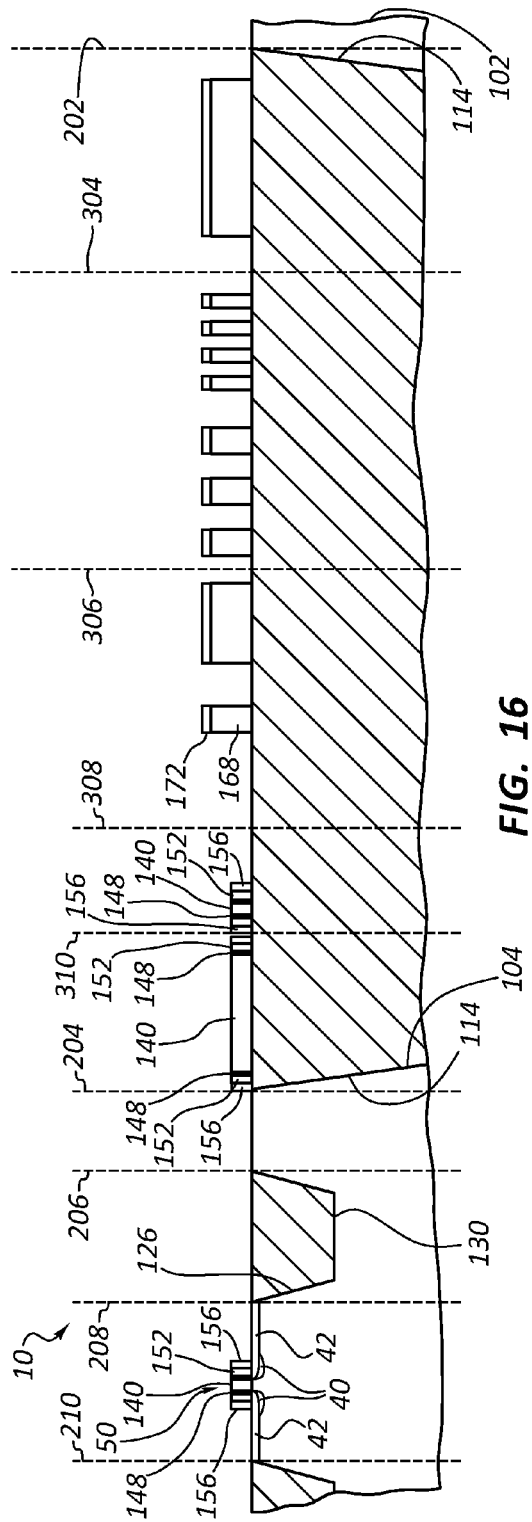

US 9,874,693 B2

METHOD AND STRUCTURE FOR INTEGRATING PHOTONICS WITH CMOS

GOVERNMENT RIGHTS STATEMENT

This invention was made with government support under Defense Advanced Research Projects Agency (DARPA) of the United States, under grant contract number HR0011-11-9-0009. The government may have certain rights in the invention.

BACKGROUND

Commercially available semiconductor structures can include wafers, such as bulk silicon or silicon-on-insulator (SOI) wafers. On such wafers there can be formed one or more type of device such as a field effect transistor (FET).

Semiconductor structures can include isolation regions that separate active device regions of the semiconductor structure. In some commercially available arrangements for example, an isolation region can separate a first active device FET region from a second active device FET region. A first active device FET region can be an nFET region having nFETs and a second active device FET region can be a pFET region having pFETs. In some cases isolation regions can include trenches. Various methods are used for formation of trenches. According to one known method, lithography techniques can be used for patterning trenches. Formed isolation region trenches can be filled with dielectric material, e.g., oxide.

BRIEF DESCRIPTION

The shortcomings of the prior art are overcome, and additional advantages are provided, through the provision, in one aspect, of a semiconductor structure.

A semiconductor structure can include an active device FET region having a FET and a photonics region having a photonic device including a waveguide. A semiconductor structure can include an active device FET region having a FET and a trench isolation region having a photonic device that includes a waveguide. A method can include forming a FET at an active device FET region of a semiconductor structure. A method can include forming a photonic device at a trench isolation region of a semiconductor structure.

According to a method, a dielectric layer can be formed that extends over a gate structure within an active device FET region of a semiconductor structure and over a trench isolation region. A section of material of the dielectric layer can be removed at the trench isolation region and a waveguiding material layer can be formed at the trench isolation region.

Additional features and advantages are realized through the techniques of the present disclosure.

BRIEF DESCRIPTION OF THE SEVERAL VIEWS OF THE DRAWINGS

One or more aspects of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which;

FIG. 9 is an expanded cross sectional view of a semiconductor structure in an intermediary stage of fabrication as shown in FIG. 8;

FIG. 10 is a cross sectional view of semiconductor structure in an intermediary stage of fabrication after patterning of a layer that defines a gate structure and a structure of a photonic device;

FIG. 13 is a cross sectional view of semiconductor structure in an intermediary stage of fabrication after removal of material of a dielectric layer;

FIG. 14 is a cross sectional view of semiconductor structure in an intermediary stage of fabrication after removal of material of one or more dielectric layer from a section of a photonics region and after formation of a waveguiding material layer;

FIG. 15 is a cross sectional view of semiconductor structure in an intermediary stage of fabrication after patterning of a section of a photonics region;

FIG. 16 is a cross sectional view of semiconductor structure in an intermediary stage of fabrication after removal of material from various layers;

DETAILED DESCRIPTION

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and not by way of limitation. Various substitutions, modifications, additions, and/or arrangements, within the spirit and/or scope of the underlying concepts will be apparent to those skilled in the art from this disclosure.

A semiconductor structure can include an active device FET region having a FET and a photonics region having a photonic device including a waveguide. A semiconductor structure can include an active device FET region having a FET and a trench isolation region having a photonic device that includes a waveguide. A method can include forming a FET at an active device FET region of a semiconductor structure. A method can include forming a photonic device at a trench isolation region of a semiconductor structure.

According to a method, a dielectric layer can be formed that extends over a gate structure within an active device FET region of a semiconductor structure and over a trench isolation region. A section of material of the dielectric layer can be removed at the trench isolation region and a waveguiding material layer can be formed at the trench isolation region.

Figure 1:
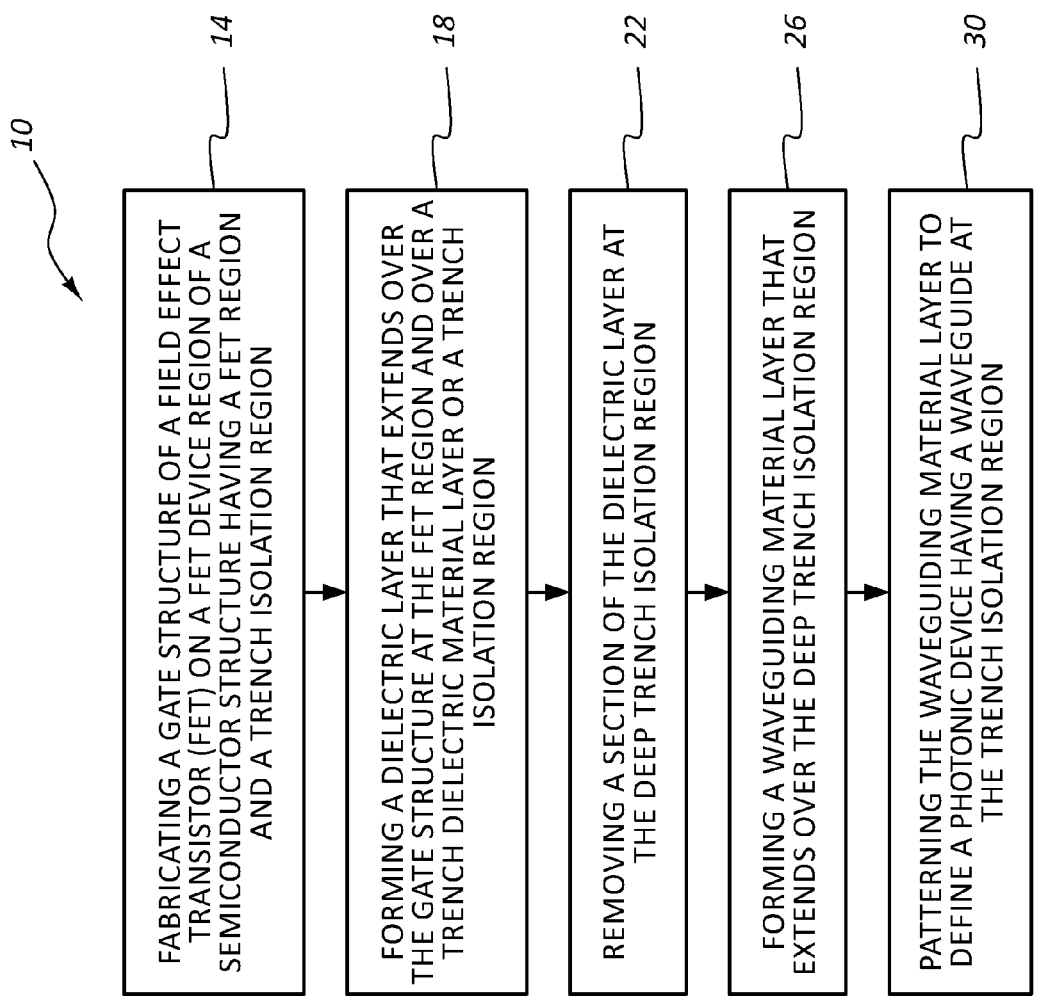
FIG. 1 is a flow diagram illustrating a method for fabrication of a semiconductor structure.

Referring to the flow diagram of FIG. 1 there is set forth a method for fabrication of a semiconductor structure having both one or more CMOS Field Effect Transistor (FET) and one or more photonic device, e.g., a waveguide or other device having a waveguide.

At block 14 there can be performed fabricating a gate structure of a FET at an active device FET region of a semiconductor structure that includes a FET region, and a trench isolation region. At block 18 there can be performed forming one or more dielectric layer that extends over the FET gate structure at the FET region and over a trench dielectric layer of the trench isolation region. At block 22 there can be performed removing a section of the one or more dielectric layer at the trench isolation region. At block 26 there can be performed forming a waveguiding material layer that extends over the trench dielectric layer of the trench isolation region. At block 30, there can be performed patterning the waveguiding material layer to form a waveguide at the trench isolation region. An exemplary fabrication method in accordance with the method set forth in FIG. 1 is described with reference to FIGS. 2-17.

Figure 2:
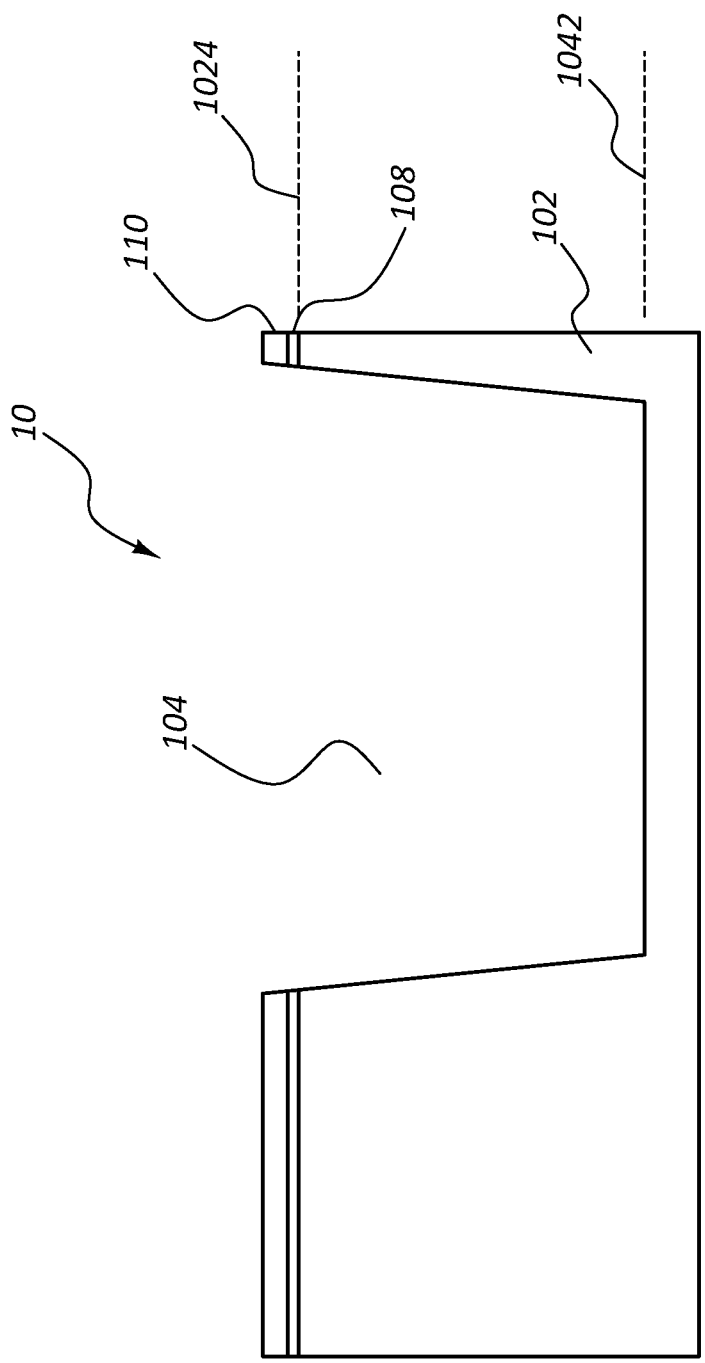
FIG. 2 is a cross sectional view of a semiconductor structure in an intermediary stage of fabrication after formation of a deep trench.

Referring to FIG. 2 semiconductor structure 10 can include substrate 102 which can be formed of silicon, layer 108 which can be formed of dielectric material, e.g., oxide and layer 110 which can be a nitride layer, e.g., SiN.

Referring to FIG. 2, layer 110 can be regarded as a mask layer and can be previously patterned to define a mask to facilitate removal of material from layer 108 and from substrate 102 for defining of trench 104, which can be a deep trench.

Figure 3:
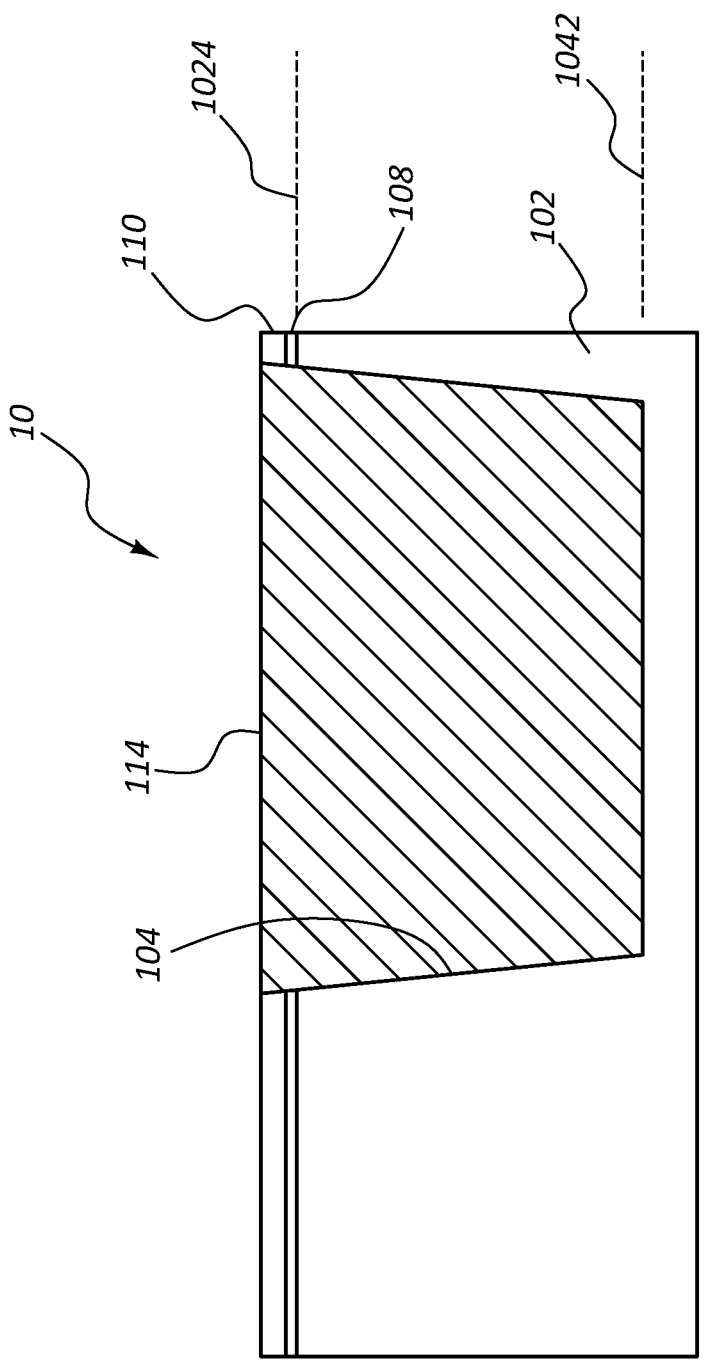
FIG. 3 is a cross sectional view of a semiconductor structure in an intermediary stage of fabrication after formation of dielectric layer within a deep trench.
Figure 4:
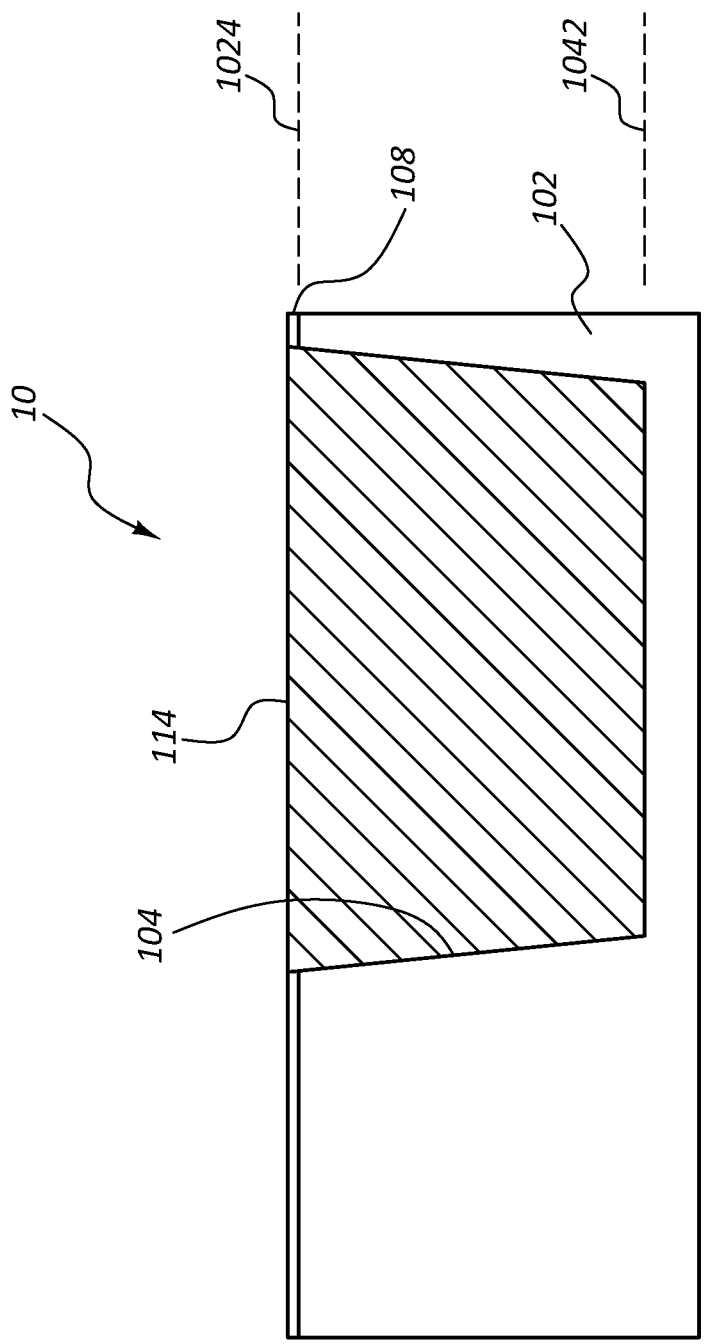
FIG. 4 is a cross sectional view of a semiconductor structure in an intermediary stage of fabrication after removal of a layer formed of hard mask material.

FIG. 3 illustrates the semiconductor structure 10 as shown in FIG. 2, after formation of layer 114 on substrate 102 within trench 104. Layer 114 can be formed to initially overfill trench 104 (overfill stage not shown) and then can be planarized as shown in FIG. 3 so that a top surface of layer 114 can be coplanar with the top surface of layer 110. FIG. 4 illustrates the semiconductor structure 10 as shown in FIG. 3 after recessing of layer 114 and after removing of layer 110. In the fabrication stage depicted in FIG. 4, the top surface of layer 114 can be coplanar with the top surface of layer 108. Layer 114 in one embodiment can be formed of a dielectric material, e.g., oxide. Layer 114 which can fill trench 104 can be regarded as a trench dielectric layer.

In one embodiment, trench 104 can have a height, as measured from a bottom elevation 1042 of trench 104 to a top elevation 1024 of substrate 102 of from about 1000 nm to about 2000 nm and in one embodiment can have a height of about 1500 nm. As will be set forth herein, a deep trench isolation region having layer 114, can support one or more photonic devices, e.g., one or more waveguide and/or other photonic device having one or more waveguide, e.g., a photodetector, a modulator, a grating coupler. A presence of a dielectric filled deep trench can minimize coupling between one or more photonic devices and substrate 102.

Figure 5:
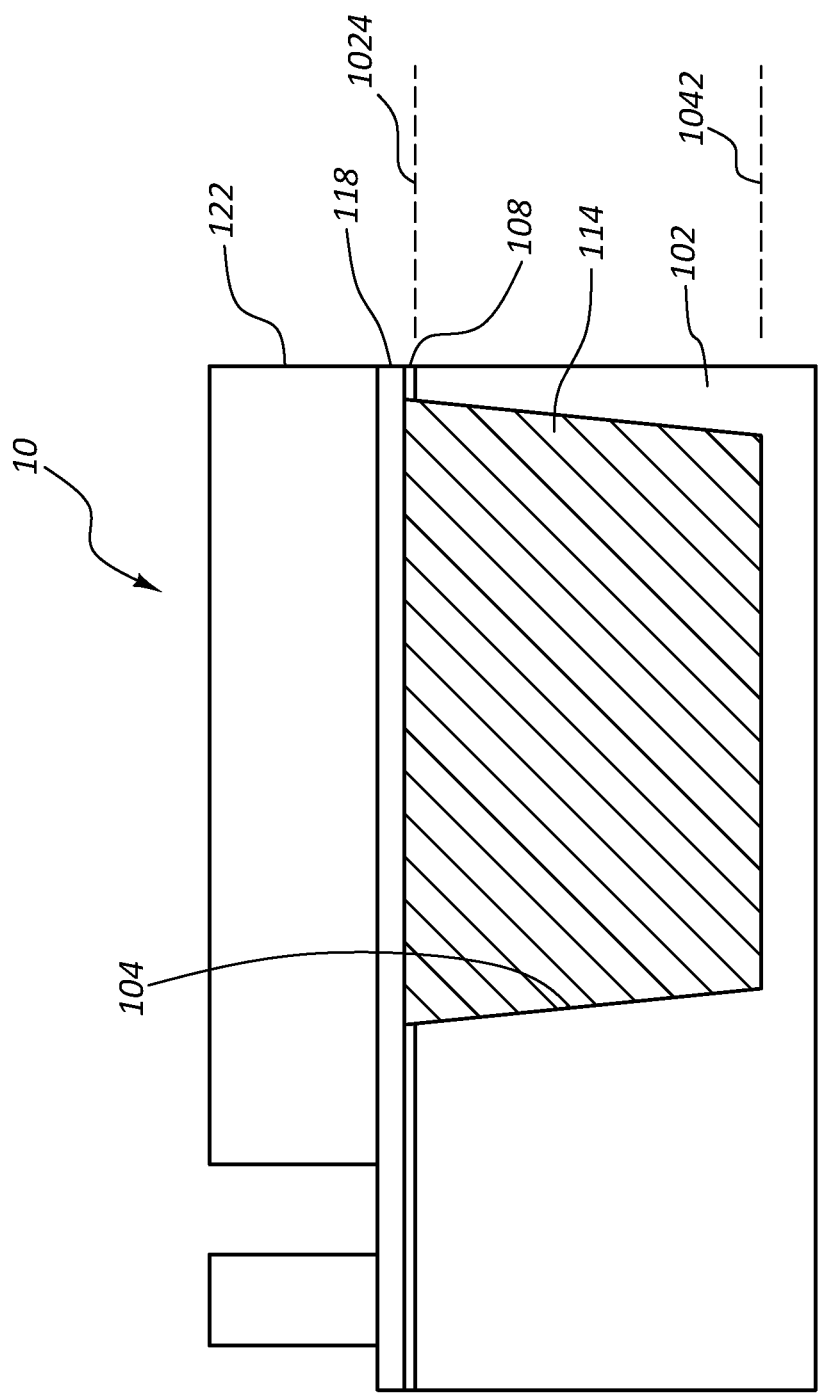
FIG. 5 is a cross sectional view of a semiconductor structure in an intermediary stage of fabrication after formation of a layer which can be formed of photoresist material.

FIG. 5 illustrates semiconductor structure 10 as shown in FIG. 4 after formation of layer 118. A first section of layer 118 can be formed over layer 108 and a second section of layer 118 can be formed over layer 114 that fills trench 104. In one embodiment, a first section of layer 118 can be formed on layer 108 and a second section of layer 118 can be formed on layer 114 that can fill trench 104. FIG. 5 further illustrates formation of layer 122 over layer 118. Layer 122 can be formed on layer 118. Layer 118 can be formed of a dielectric material, e.g., nitride, e.g., SiN and layer 122 can be formed of photoresist material. Layer 122 can be a mask layer and can be used for patterning one or more shallow trench within substrate 102.

Figure 6:
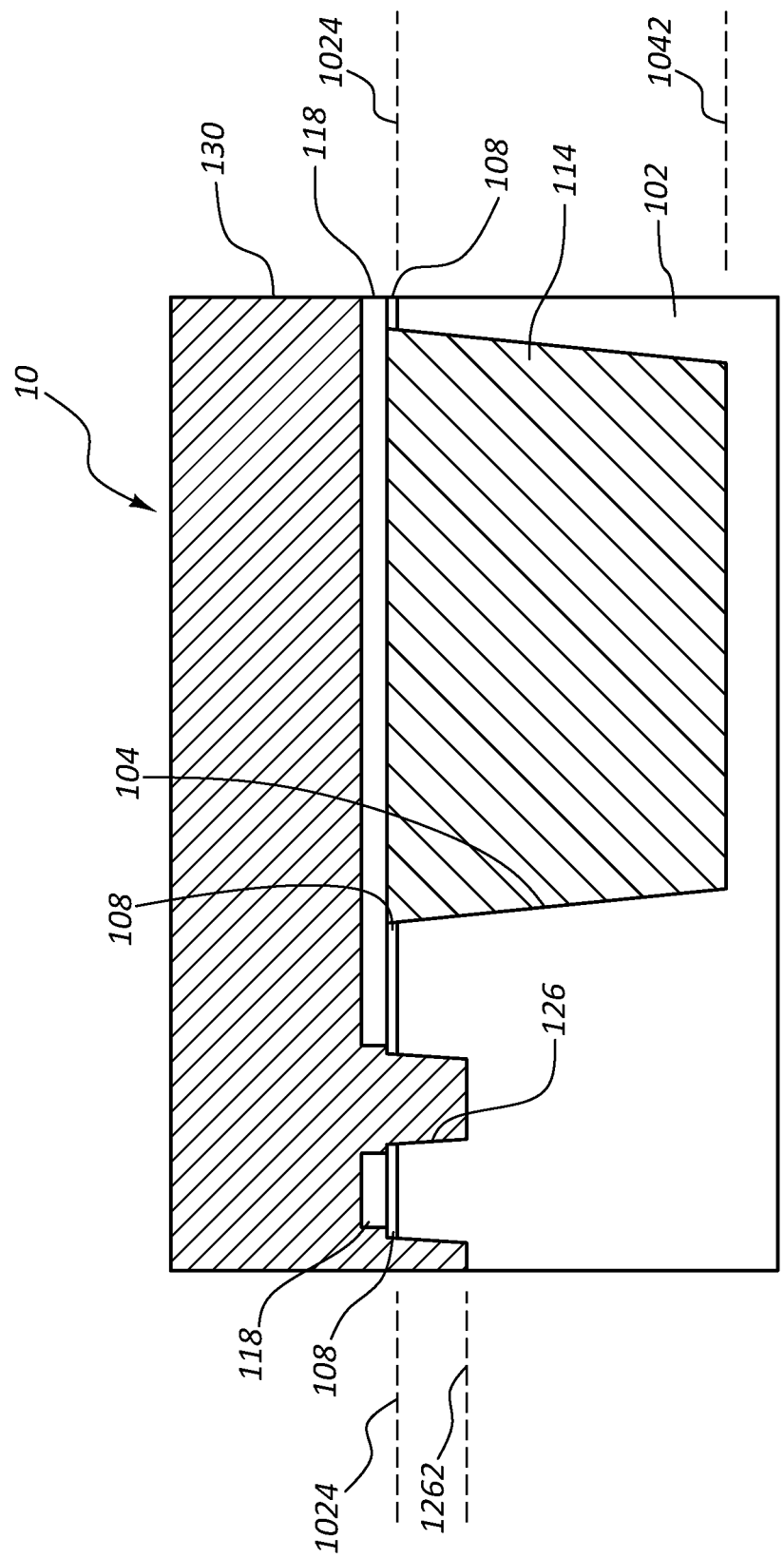
FIG. 6 is a cross sectional view of a semiconductor structure in an intermediary stage of fabrication after formation of a dielectric layer.
Figure 7:
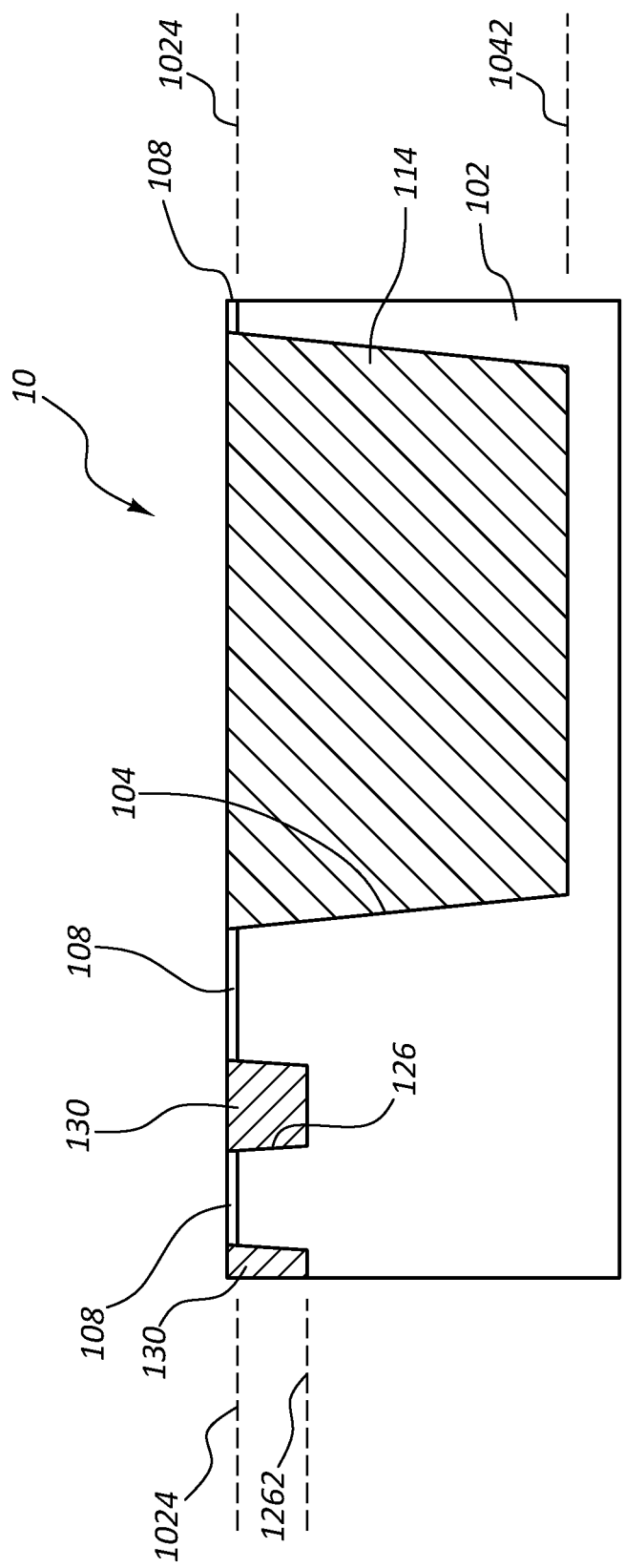
FIG. 7 is a cross sectional view of semiconductor structure in an intermediary stage of fabrication after removal of material of a dielectric layer.

FIG. 6 illustrates the semiconductor structure 10 as shown in FIG. 5 after patterning of trench 126 which can be a shallow trench and after formation of layer 130. Trench 126 and layer 118 can be patterned using layer 122 (FIG. 5). In one embodiment, a first section of layer 130 can be formed over layer 102 and a second section of layer 130 can be formed over layer 118. A first section of layer 130 can be formed on layer 102 within an area of layer 102 that defines trench 126 and a second section of layer 130 can be formed on layer 118. Layer 130 in one embodiment can be formed of a dielectric material, e.g., oxide. Layer 130 which can fill trench 126 can be regarded as a trench dielectric layer. FIG. 7 illustrates the semiconductor structure 10 as shown in FIG. 6, after the planarizing of layer 130, recessing layer 130 to a predetermined height relative to layer 108 and the removal of layer 118.

In one embodiment, trench 126 can have a height from a bottom elevation 1262 of trench 126 to a top elevation 1024 of substrate 102 of from about 100 nm to about 500 nm and in one embodiment can have a height of about 300 nm. At the intermediary fabrication stage depicted at FIG. 7, various processes can be performed for formation of one or more FET within one or more active device FET region of semiconductor structure 10. Such processes can include, e.g., well ion implantation, ion implantation for threshold voltage adjustment, and well activation annealing.

Figure 8:
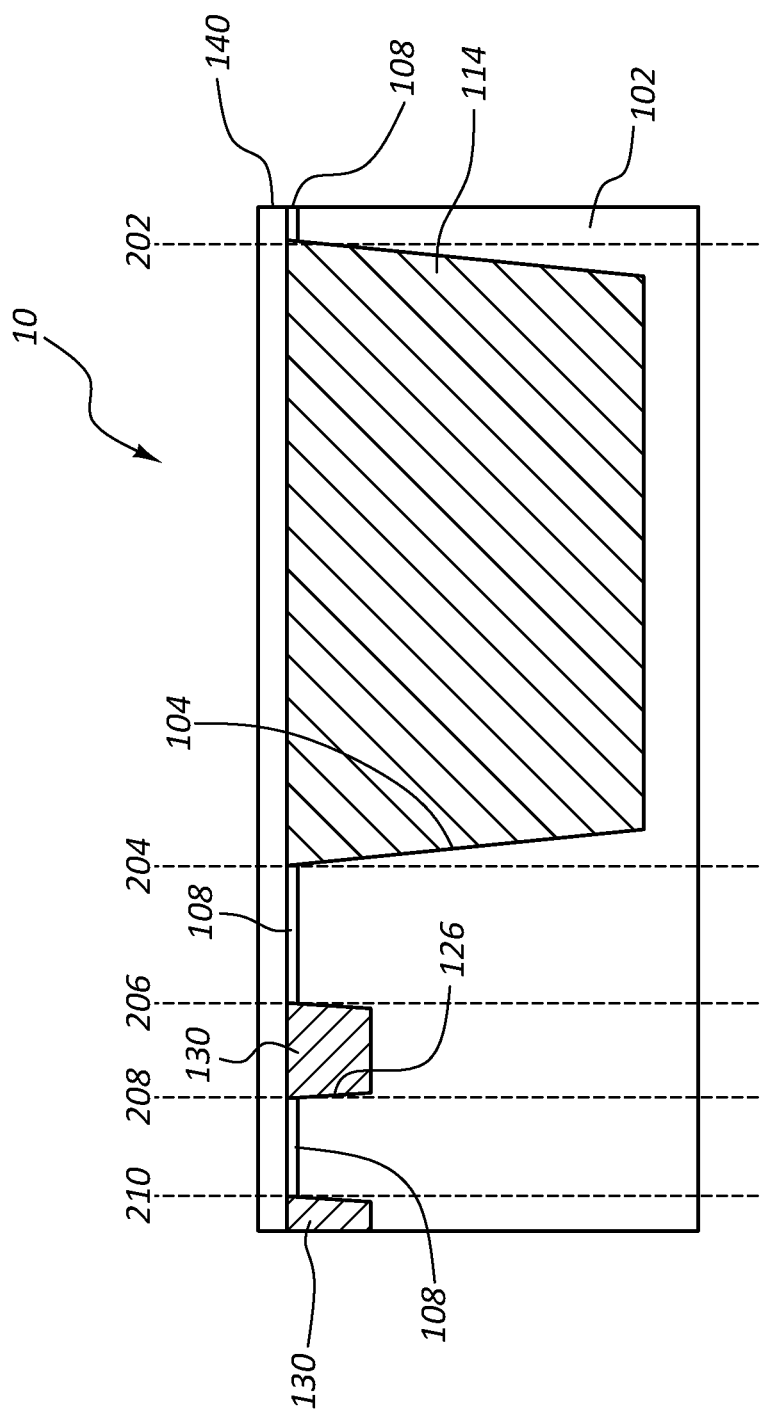
FIG. 8 is a cross sectional view of semiconductor structure in an intermediary stage of fabrication after formation of a semiconductor material layer that can be patterning to define a gate structure and a waveguide.

FIG. 8 illustrates semiconductor structure 10 as shown in FIG. 7 after formation of layer 140. Layer 140 can be formed of semiconductor material in one embodiment e.g., polysilicon. Layer 140 can be regarded as a semiconductor material layer. After formation of layer 140, layer 140 can be subject to processes for minimizing roughness of layer 140. In one embodiment, a first section of layer 140 can extend over substrate 102, a second section of layer 140 can extend over layer 130 that fills trench 126, and a third section of layer 140 can extend over layer 114 that fills trench 104. A first section of layer 140 can be formed on layer 108 that can be formed on substrate 102, a second section of layer 140 can be formed on layer 130 that fills trench 126 and a third section of layer 140 can be formed on layer 114 that fills trench 104. Layer 140 as set forth herein can be patterned to define a gate structure of one or more FET and can be patterned to define a waveguide of one or more photonic device.

FIG. 9 is an expanded wide area view of semiconductor structure 10 as shown in FIG. 8, with layer 108 not depicted. As shown in FIG. 9 semiconductor structure 10 can include one or more shallow trench isolation region, e.g., the region between vertical plane 206 and vertical plane 208 and one or more active device FET region, e.g., the region at location A defined between vertical planes 208 and 210 and one or more deep trench isolation region, e.g., the region defined between vertical planes 202 and 204. A deep trench isolation region as set forth herein can include one or more photonic device and can also be regarded as a photonics region.

To the left of the active device FET region between vertical plane 208 and vertical plane 210 there can be defined at location B a shallow trench isolation region configured in the manner of the shallow trench isolation region between vertical plane 206 and vertical plane 208. To the left of the shallow trench isolation region at location B there can be an active device FET region (not shown) of polarity opposite to the polarity of the active device FET region at location A, e.g., can be an nFET region in the case the region at location A is a pFET active device FET region or a pFET region in the case the region at location A is an nFET active device FET region.

FIG. 10 illustrates semiconductor structure 10 as shown in FIG. 9 after formation of layer 144 for use in patterning layer 140. In one embodiment, layer 140 can be a semiconductor material layer and layer 144 can be a photoresist layer. Layer 144 can be a mask layer. Photoresist layer 144 can be used to pattern layer 140 which can be formed of semiconductor material, e.g., polysilicon in one embodiment. In the active device FET region between vertical plane 208 and vertical plane 210, layer 140 can be patterned to form a gate structure of a FET. The gate structure can be a sacrificial gate structure or a non-sacrificial gate structure. In the section of the deep trench isolation region (photonics region) between vertical plane 310 and vertical plane 204, layer 140 can be patterned for the formation of a photonic device provided by a photodetector having a waveguide defined by layer 140. In the section of the deep trench isolation between vertical plane 308 and vertical plane 310, layer 140 can be patterned for the formation of a photonic device provided by a waveguide defined by layer 140.

Figure 11:
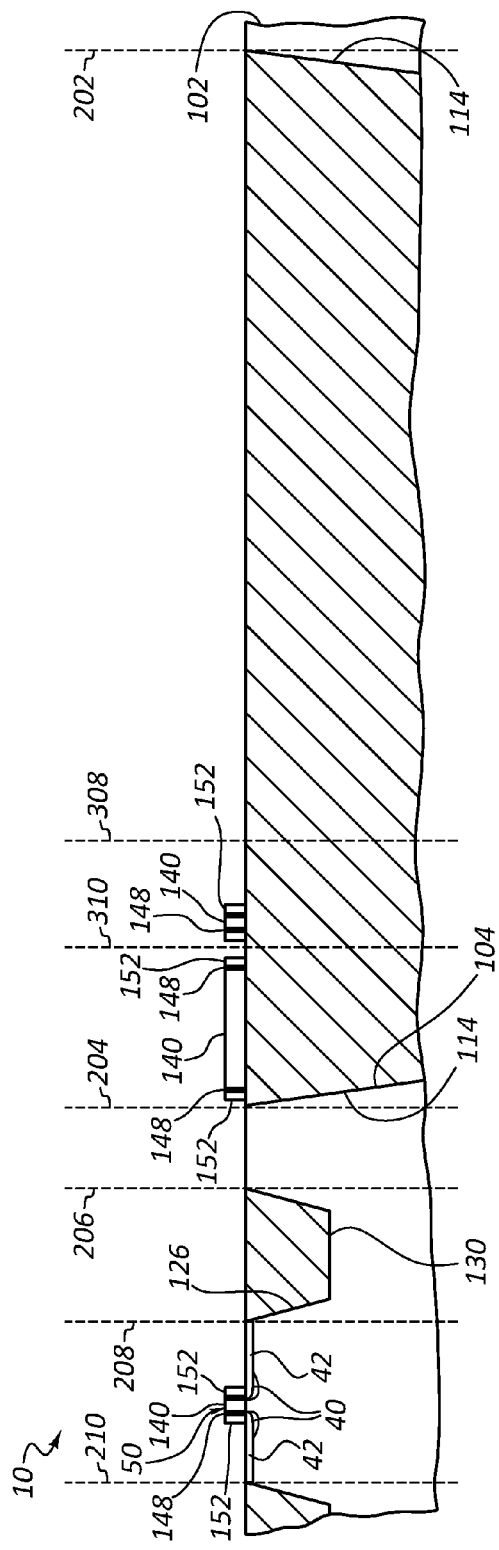
FIG. 11 is a cross sectional view of semiconductor structure in an intermediary stage of fabrication after formation of a spacer material layer.

FIG. 11 illustrates semiconductor structure 10 as shown in FIG. 10 after removal of layer 144 and after formation of layer 148 and layer 152. Layer 148 and layer 152 can be first and second dielectric layers to define first and second spacers of the gate structure 50 defined by layer 140 at the active FET region between plane 208 and plane 210. Layer 148 and layer 152 can define first and second spacers of the photodetector having a waveguide defined by layer 140 at the section of the deep trench isolation region between vertical plane 310 and vertical plane 204. Layer 148 and layer 152 can define first and second spacers of the waveguide defined by layer 140 at the section of the deep trench isolation region between vertical plane 308 and vertical plane 310. Layer 148 in one embodiment can be formed of oxide and can be provided by subjecting semiconductor structure 10 to an oxidation process. Layer 152 can be formed of oxide in one embodiment.

Referring further to FIG. 11, halos 40 and extensions 42 for one or more FET, e.g., the FET having gate structure 50 defined by layer 140 can be formed during the stage depicted in FIG. 11. Halos 40 and extensions 42 can be formed by subjecting substrate 102 to ion implantation within the active device FET region between vertical plane 208 and vertical plane 210.

Figure 12:
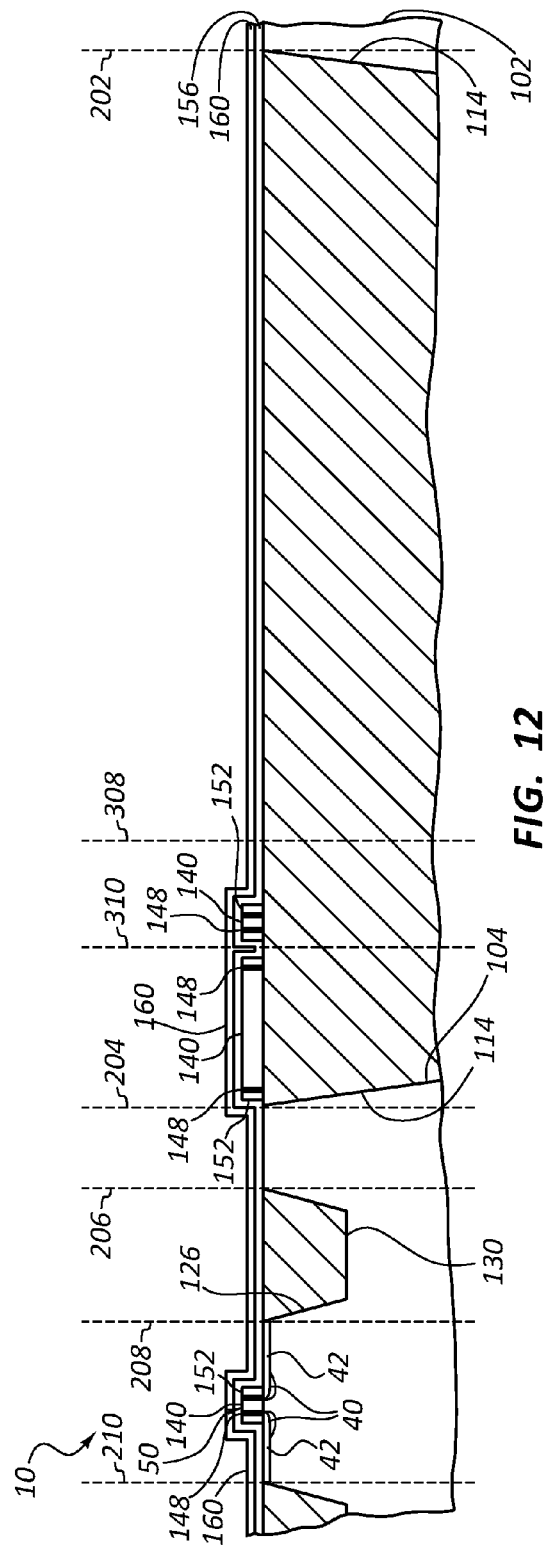
FIG. 12 is a cross sectional view of semiconductor structure in an intermediary stage of fabrication after formation of a spacer material layer and dielectric layer.

FIG. 12 illustrates semiconductor structure 10 as shown in FIG. 11 after formation of layer 156 and layer 160. Layer 156 and layer 160 can be formed of dielectric material and can be regarded as dielectric layers. Layer 156 in one embodiment can be subject to processing in a later fabrication stage to define a third spacer of a gate structure 50 defined by layer 140 at an active region between 208 and 210. Layer 160 can be a dielectric layer that defines a protect layer. Layer 160 and can be formed, e.g., of oxide. In one embodiment, layer 156 can be formed of a first dielectric material and layer 160 can be formed of a second dielectric material. Layer 156 in one embodiment can be formed of nitride, e.g., $Si^3N^4$ and layer 160 can be formed of oxide e.g., $SiO2$.

Layer 156 can be etched to a critical dimension (CD) that affects performance of a FET defined by layer 156. In one aspect layer 160 which can be a protect layer can be designed to decrease the likelihood that layer 156 is affected by processing after formation of layer 156. In such manner a likelihood can be increased that layer 156 retains a capacity to patterned to one or more CD.

Providing layer 160 so that layer 160 is formed of a second dielectric material and further so that layer 156 is formed of a first dielectric material can facilitate processing advantages. Layer 160 can protect layer 156 from being altered during subsequent fabrication stage processes including, e.g., wet etching or dry etching. The providing of layer 160 to be of a second dielectric material and the layer 156 to be of a first dielectric can facilitate removal of material of layer 160 in a manner that decreases a likelihood of alteration of layer 156 during a material removal process. Prior to patterning of layer 156 to one or more CD to define spacers of a FET within a FET region between vertical plane 206 and vertical plane 211, layer 160 can be removed to permit patterning of layer 156. With layer 160 being formed of a second dielectric material and layer 156 being formed of a first dielectric material, a selective etch process can be used that is selective to the second dielectric material preferentially to the first dielectric material, to facilitate removal of layer 160 while decreasing the likelihood that layer 156 will be altered by the removal of layer 160.

FIG. 13 illustrates semiconductor structure 10 as shown in FIG. 12 after formation of layer 164. Layer 164 can be a photoresist layer. Layer 164 can be regarded as a mask layer. Layer 164 can be used to pattern sections of layer 160 and layer 156. Layer 164 can be used to open up a section of a photonics region between vertical plane 202 and vertical plane 308. FIG. 13 illustrates a section of layer 160 removed from a section of a deep trench isolation region between vertical plane 202 and vertical plane 308 using layer 164.

FIG. 14 illustrates semiconductor 10 as shown in FIG. 13 after removal of dielectric layer 156 from a section of the deep trench isolation region (photonics region) between vertical plane 202 and vertical plane 308 and after formation of layer 168 and layer 172 over semiconductor structure 10. Layer 168 can be formed of waveguiding material, e.g., polysilicon. Layer 168 can be regarded as a waveguiding material layer. Layer 172 can be a dielectric layer that defines a hard mask layer and a protect layer and can be formed, e.g., of oxide such as $SiO_2$.

Regarding removal of material of layer 160 and layer 156 as set forth in FIGS. 13 and 14, removal of material can be performed using, e.g., wet etch or dry etch processes. Semiconductor material layer 140 can be subject to patterning to one or more critical dimension (CD) to provide one or more active device FET and/or one or more photonic device. The patterning of layer 140 to one or more CD can include patterning after formation of layer 148. One or more dielectric layer, e.g., layer 160, layer 156, layer 152, or layer 148 can protect semiconductor material layer 140 so that a likelihood of semiconductor material retaining the capacity to feature the one or more CD after performance of one or more stressful fabrication process subsequent to the formation of layer 140 is increased. One or more dielectric layer, e.g., layer 160, layer 156, layer 152, or layer 148 when dielectric material is removed from the deep trench isolation region between vertical plane 202 and vertical plane 308, can protect semiconductor material layer 140 at the active FET device region between vertical plane 208 and vertical plane 210 and at the deep trench isolation region (photonics region) between vertical plane 308 and vertical plane 204.

FIG. 15 illustrates semiconductor structure 10 as shown in FIG. 14 after formation of layer 176 over layer 172 and after removal of layer 160 from a section of semiconductor structure 10 to the left of vertical plane 308. Layer 176 can be a photoresist mask layer and can be used to pattern layer 172 and layer 168. By the patterning of layer 168 various photonic devices can be defined in a section of the photonics region between vertical plane 202 and vertical plane 308. As shown in FIG. 15 layer 176 can be used to define different sections of layer 168 formed of waveguiding material. With layer 176 applied, material of layer 172 and layer 168 can be removed other than in sections of layer 172 and layer 168 covered by layer 176. With layer 176 formed over a section of the photonics region between vertical plane 202 and vertical plane 308, layer 160 which can be a protect layer can be removed in the sections in which layer 160 remains, namely in the sections of semiconductor structure 10 between vertical plane 308 and vertical plane 210.

Waveguiding material layer 168 can be subject to patterning to one or more critical dimension (CD) to provide one or more photonic device. Layer 172 can be a protect layer that protects waveguiding material layer 168 so that a likelihood of waveguiding material retaining the capacity to feature the one or more CD after performance of one or more stressful fabrication process subsequent to the formation of layer 168 is increased.

FIG. 16 illustrates the semiconductor structure 10 as shown in FIG. 15 after removal of layer 176 within the section of semiconductor structure 10 within the photonics region between vertical plane 202 and vertical plane 308, and after patterning of layer 156 within the section between vertical plane 308 and 210 to define spacers of one or more FET such as a FET having gate structure 50, and spacers of one or more photonic device, e.g., one or more photonic device between vertical plane 308 and vertical plane 204.

Patterning of layer 156 to define spacers between vertical plane 308 and vertical plane 210 can be performed using an anisotropic etch process that results in etching of horizontally oriented features preferentially to vertically oriented features so that vertically oriented features remain after performance of the etch process. Such anisotropic etch process can be material selective so that material of layer 156 is removed preferentially to material of layers other than layer 156.

Figure 17:
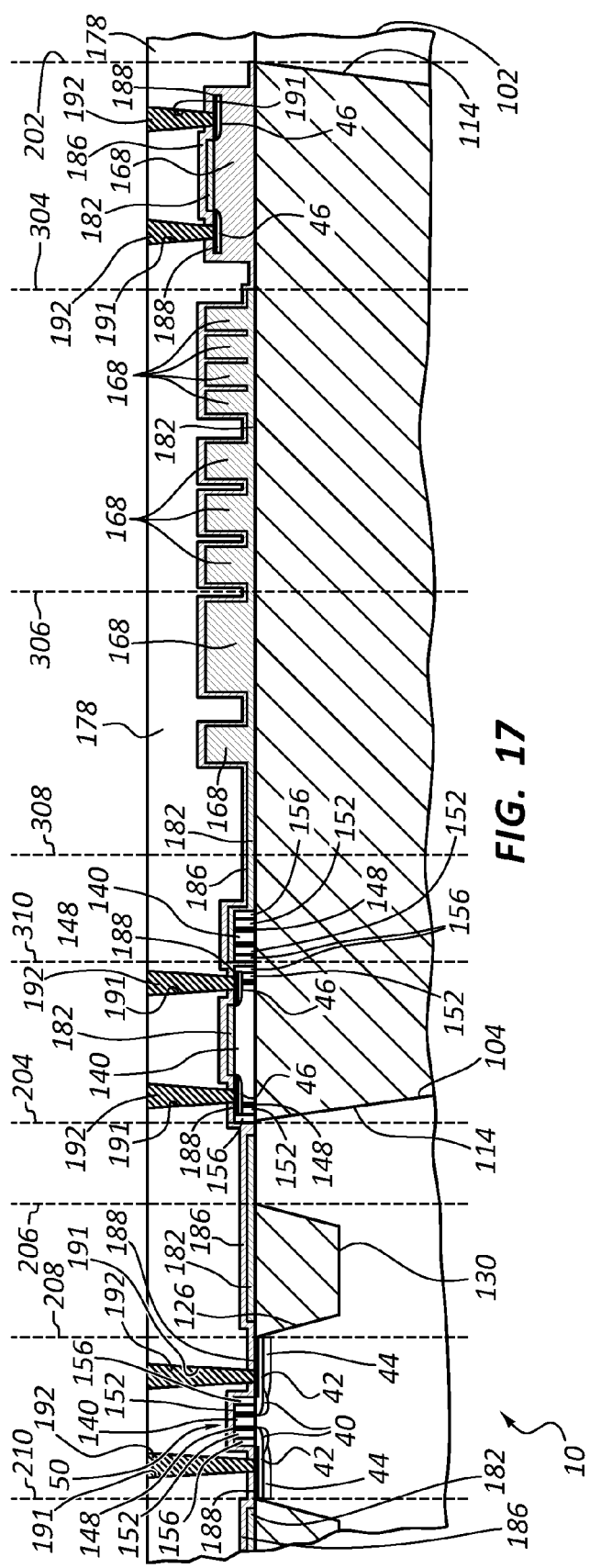
FIG. 17 is a cross sectional view of a semiconductor structure after completion various device fabrication processes including a metallization process for formation of contact formations defined by sections of a contact layer.

FIG. 17 illustrates semiconductor structure 10 as shown in FIG. 16 after completion of stages to fabricate FETs at the representative active device FET region between vertical plane 208 and vertical plane 210 and to fabricate photonic devices at the representative deep trench isolation region (which can be regarded as a photonics region) between vertical plane 202 and vertical plane 204.

Subsequent to the stage depicted in FIG. 16 various processes can be performed for completion of devices within one or more FET region and one or more deep trench isolation region of structure 10. In one aspect layer 140 which can be a semiconductor material layer can be subject to selective ion implantation (n, p, n+, p+) for providing various photonic devices defined by layer 140. In one aspect, layer 168 which can be a waveguiding material layer can be subject to selective ion implantation (n, p, n+, p+) for providing of various photonic devices defined by layer 168. In one aspect (not shown in the embodiment depicted in FIG. 17), layer 168 can be subject to notch patterning and final notch patterning for shaping of photonic devices defined by layer 168. In one aspect, contact layer interfaces of one or more active FET device of semiconductor structure 10 and/or one or more photonic device within one or more deep trench isolation region of semiconductor structure 10 can be subject to a silicidation process for formation of a silicide formation for reduction of contact resistance between an electrode and a contact defined by a contact layer.

In the section of the deep trench isolation region between vertical plane 202 and vertical plane 304 layer 168 can be patterned to provide a photonic device in the form of a modulator having a waveguide defined by layer 168. In the section of the deep trench isolation region between vertical plane 308 and vertical plane 204 layer 140 can be patterned to provide a photonic device in the form of a modulator having a waveguide defined by layer 140. In the section of the deep trench isolation region between vertical plane 304 and vertical plane 306 layer 168 can be patterned to provide a photonic device in the form of a grating coupler having waveguides defined by layer 168. In the section the deep trench isolation region between vertical plane 306 and vertical plane 308 layer 168 can be patterned to provide photonic devices in the form of waveguides defined by layer 168.

Waveguides defined by layer 168 can be of a second thickness greater than a thickness of waveguides formed by patterning layer 140 in the section of the deep trench isolation region between vertical plane 308 and vertical plane 204. In one embodiment, layer 140 can have a thickness of between about 50 nm and about 150 nm to facilitate fabrication of gate structures and photonic devices, e.g., waveguides in that height range and layer 168 can have a thickness of between about 170 nm and about 290 nm to facilitate fabrication of photonic devices, e.g., waveguides in that height range. In one embodiment, layer 140 can have a thickness of about 100 nm to facilitate fabrication of gate structures and photonic devices, e.g., waveguides having a height of about 100 nm and layer 168 can have a thickness of about 220 nm to facilitate fabrication of photonic devices, e.g., waveguides having a height of about 220 nm.

At the stage depicted in FIG. 17 source-drains having halos 40 extensions 42 and deep source-drain sections 44 can be completed by ion implantation of substrate 102 to form deep source-drain sections 44.

FIG. 17 illustrates the semiconductor structure 10 as shown in FIG. 16 after formation of deep source-drain sections 44 within the section of semiconductor structure 10 within the vertical planes 208 and 210, after formation of n-p sections 46 of photonic devices within the section of semiconductor structure 10 within the vertical planes 202 and 304 and within the section of semiconductor structure 10 within the vertical planes 310 and 204. At the stage depicted in FIG. 17, n-p sections 46 can be formed by ion implantation.

FIG. 17 further illustrates the semiconductor structure 10 as shown in FIG. 16 after formation of layer 178, silicide formations 188, layer 182, layer 186 and layer 192. Layer 178 can be formed of dielectric material, e.g., oxide. Contact holes 191 can be formed in layer 178 and layer 192 can be formed within the contact holes. Layer 182 can be formed of dielectric material e.g., nitride. Layer 182 can be a nitride layer that blocks formation of silicide formation 188. Layer 186 can be formed of dielectric material, e.g., nitride. Layer 186 can be regarded as a barrier layer. Layer 192 can be formed of a metal or other conductive material, e.g., tungsten (W), silver (Ag), gold (Au) or copper (Cu). Layer 192 can be a contact layer.

Each silicide formation 188 can reduce a contact resistance between an electrode (e.g., a source-drain within a FET region between the vertical planes 208 and 210, an n-p section 46 within a photonics region between vertical planes 202 and 304, or an n-p section 46 within a photonics region between vertical plane 310 and vertical plane 204) and a section of contact layer 192. A silicide process can be used for the formation of silicide formation 188. A silicide process can include the reaction of a thin metal film with silicon. Thin metal films for use in formation of silicide formations 188 can include, e.g., platinum, nickel, nickel+platinum, cobalt, titanium and tungsten.

Layer 182 can be patterned as is shown in FIG. 17 to define first sections of semiconductor structure 10 covered by layer 182 and second sections of semiconductor structure 10 not covered by layer 182. The described patterning can restrict the formation of silicide formations 188 to sections of semiconductor structure 10 not covered by layer 182. The patterning of layer 182 can facilitate the self-alignment of silicide formations 188. A silicide process in which formed silicide formations 188 are self-aligned can be referred to as a salicide process. As shown in FIG. 17, remaining sections of layer 182 to the left of vertical plane 204 can restrict a formation of sidewall formations 188 that are formed to the left of vertical plane 204 to the active device FET region of semiconductor structure 10 between vertical plane 208 and vertical plane 210. Remaining sections of layer 182 within the deep trench (photonics) region between vertical plane 202 and vertical plane 210 can restrict the sections in which silicide formations 188 are formed to thus reduce a likelihood of shorting, e.g., between opposite polarity n-p sections 46 (one of a first polarity, n or p, one of the opposite polarity) of a photonics device, e.g., the photonics device between the vertical planes 202 and 304 or the photonics device between the vertical planes 310 and 204. Layer 182 within the deep trench region (photonics region) between vertical plane 308 and vertical plane 304 prohibits silicide formation on photonics devices, e.g., waveguides and photonic devices having waveguides, e.g., grating couplers.

Various processes can be performed for modifying a grain structure of semiconductor material layer 140 or waveguiding material layer 168 from which various photonic devices can be fabricated. In one embodiment, one or more of semiconductor material layer 140 or waveguiding material layer 168 can be formed of polysilicon. In one embodiment, ion implantation can be performed to modify the silicon crystal structure of one or more of semiconductor material layer 140 or waveguiding material layer 168. On modification, polysilicon material of one or more of layer 140 or layer 168 can be transformed into amorphous polysilicon material. Ion implant species can include one or more of silicon, argon (e.g., Ar or Ar+), xenon (e.g., Xe or Xe+) or germanium. In another aspect, an annealing process, e.g., a recrystallization annealing process can be performed to further improve a grain structure of one or more of semiconductor material layer 140 or waveguiding material layer 168. In one embodiment, with or without ion implantation, one or more of semiconductor material layer 140 or waveguiding material layer 168 can be subject to annealing for modification of a grain structure of one or more of semiconductor material layer 140 or waveguiding material layer 168. In one embodiment, semiconductor structure 10 can be subject to annealing at a temperature between about 500 degrees Celsius to about 700 degrees Celsius after the stage depicted in FIG. 16. A time period for annealing can range from about 5 seconds to about 18,000 seconds in one embodiment.

There is set forth herein in reference e.g., to FIG. 11 a semiconductor structure 10 comprising a FET region, e.g., between vertical plane 208 and vertical plane 210, and a trench isolation region, e.g., between vertical plane 202 and vertical plane 204, a first section of a semiconductor material layer 140, e.g., between vertical plane 208 and vertical plane 210, formed over a substrate 102 within the FET region. There is also set forth herein in reference e.g., to FIG. 11 a second section of the semiconductor material layer 140, e.g., between vertical plane 310 and vertical plane 204 or between vertical plane 308 and vertical plane 310, discontinuous with the first section of a semiconductor material layer 140, the second section formed over a trench dielectric layer 114 of the trench isolation region. In one embodiment, as illustrated in FIG. 11, the second section of semiconductor material layer 140 can be formed one the trench dielectric layer 114.

There is set forth herein, e.g., with reference to FIG. 11 a semiconductor structure 10, wherein the semiconductor structure 10 includes (a) a first spacer (defined by layer 148) adjacent to the first section of the semiconductor material layer 140 and (b) a first spacer (defined by layer 148) adjacent to the second section of the semiconductor material layer 140, wherein the features (a) and (b) are of a common material.

There is set forth herein, e.g., with reference to FIG. 11 a semiconductor structure 10, wherein the semiconductor structure 10 includes (a) a first spacer (defined by layer 148) adjacent to the first section of a semiconductor material layer 140, (b) a second spacer (defined by layer 152) for the first section of the semiconductor material layer 140 adjacent to the feature (a), (c) a first spacer (defined by layer 148) adjacent to the second section of the semiconductor material layer 140, (d) a second spacer (defined by layer 152) for the second section of semiconductor material layer 140 adjacent to the feature (c), wherein the features (a) and (c) are of a common material, and wherein the features (b) and (d) are of a common material.

There is set forth herein, e.g., with reference to FIG. 12 a semiconductor structure 10 having a first dielectric layer, e.g., layer 156 or layer 160, formed over a substrate 102, the first dielectric layer extending within a FET region, e.g., between vertical plane 208 and vertical plane 210, and extending within a trench isolation region, e.g., between vertical plane 202 and vertical plane 204.

There is set forth herein, e.g., with reference to FIG. 12 a semiconductor structure 10 having a first dielectric layer, e.g., layer 156, formed over a substrate 102, and a second dielectric layer, e.g., layer 160, formed over the first dielectric layer 156, the first dielectric layer and the second dielectric layer extending within a FET region, e.g., between vertical plane 208 and vertical plane 210, and extending within a trench isolation region, e.g., between vertical plane 202 and vertical plane 204, the first dielectric material layer e.g., layer 156 being formed of a first dielectric material, the second dielectric layer e.g., layer 160 being formed of a second dielectric material.

There is set forth herein, e.g., with reference to FIG. 14 a semiconductor structure 10 having a first dielectric layer, e.g., layer 156 or layer 160 formed over the substrate 102, the first dielectric material extending within the FET region, e.g., between vertical plane 208 and vertical plane 210, and extending within the trench isolation region, e.g., between vertical plane 308 and vertical plane 204, the semiconductor structure 10 having a waveguiding material layer 168 extending within the FET region, e.g., between vertical plane 208 and vertical plane 210, and within the trench isolation region, e.g., between vertical plane 202 and vertical plane 204, the waveguiding material layer 168 having a first section, e.g., a section between vertical plane 308 and vertical plane 210, vertically under which the first dielectric layer is present and a second section, e.g., between vertical plane 202 and vertical plane 308, vertically under which the dielectric layer is absent.

There is set forth herein, e.g., with reference to FIG. 14 a semiconductor structure 10 having a first dielectric layer formed over a substrate 102, the first dielectric layer, e.g., layer 156 or layer 160, extending within the FET region, e.g., between vertical plane 208 and vertical plane 210, and extending within the trench isolation region, e.g., between vertical plane 308 and vertical plane 204, the first dielectric layer having a first section (e.g., a section between vertical plane 208 and vertical plane 210, a section between vertical plane 310 and vertical plane 204, or a section between vertical plane 308 and vertical plane 310) vertically under which the semiconductor material layer 140 is present and a second section (e.g., between vertical plane 204 and vertical plane 208, or a section between vertical plane 202 and vertical plane 308) vertically under which the semiconductor material layer 140 is absent.

There is set forth herein, e.g., with reference to FIG. 14 a semiconductor structure 10 having a first dielectric layer, e.g., layer 156 or layer 160, formed over the substrate 102, the first dielectric layer extending within the FET region, e.g., between vertical plane 208 and vertical plane 210, and extending within the trench isolation region, e.g., between vertical plane 308 and vertical plane 310, the trench isolation region having a trench dielectric layer 114 formed within a trench, wherein the trench dielectric layer 114 has a first section, e.g, a section between vertical plane 308 and vertical plane 204, vertically above which the first dielectric layer is present and a second section, e.g., between vertical plane 202 and vertical plane 308, vertically above which the first dielectric layer is absent.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes." or "contains" one or more features possesses those one or more features, but is not limited to possessing only those one or more features. Forms of the term "defined" encompass relationships where an element is partially defined and relationships where an element is entirely defined. Numerical identifiers herein, e.g., "first" and "second" are arbitrary terms to designate different elements without designating an ordering of elements. Furthermore, a system method or apparatus that is configured in a certain way is configured in at least that way, but may also be configured in ways that are not listed. Furthermore, a system method or apparatus set forth as having a certain number of elements can be practiced with less than or greater than the certain number of elements.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabricating a photonic structure comprising:
    fabricating a gate structure for a field effect transistor (FET) at a FET region of a semiconductor structure that includes a FET region and a trench isolation region;
    forming one or more dielectric layer that extends over the gate structure at the FET region and over a trench dielectric layer of the trench isolation region;
    removing a section of the one or more dielectric layer at the trench isolation region;
    forming a waveguiding material layer that extends over the trench dielectric layer of the trench isolation region; and
    patterning the waveguiding material layer to provide a photonic device having a waveguide defined by the waveguiding material layer at the trench isolation region.

2. The method of claim 1, wherein the forming includes forming the waveguiding material layer so that the waveguiding material layer extends over the gate structure.

3. The method of claim 1, wherein the gate structure is a non-sacrificial gate structure.

4. The method of claim 1, wherein the gate structure is a sacrificial gate structure.

5. The method of claim 1, wherein the forming includes forming the waveguiding material layer that extends over the trench dielectric layer of the trench isolation region and over a substrate of the trench isolation region, wherein the fabricating a gate structure includes forming a semiconductor material layer that extends over a substrate of the FET region and over the trench dielectric layer and a substrate of the trench isolation region, wherein the method includes patterning the semiconductor material layer at the FET region to form the gate structure, and patterning the semiconductor material layer to form a photonic device having a waveguide defined by the semiconductor material layer at the trench isolation region.

6. The method of claim 5, wherein the photonic device having a waveguide defined by the semiconductor material has a thickness less than a thickness of the waveguide defined by the waveguiding material layer.

7. The method of claim 5, wherein the photonic device is a photonic device selected from the group consisting of a photodetector, a grating coupler, a modulator and a waveguide.

8. The method of claim 1, wherein the method includes patterning the waveguiding material layer at a first section of the trench isolation region to provide a photodetector having a waveguide defined by the waveguiding material layer, patterning the waveguiding material layer at a second section of the trench isolation region to provide a grating coupler having a waveguide defined by the waveguiding material layer, and patterning the waveguiding material layer at a third section of the trench isolation region to provide a modulator having a waveguide defined by the waveguiding material layer.

9. The method of claim 1, wherein the method includes performing ion implantation of a substrate to form halos and extensions within the FET region prior to the forming of the waveguiding material layer.

10. The method of claim 1, wherein the method includes forming in a substrate of the semiconductor structure a deep trench and a shallow trench.

11. The method of claim 1, wherein the gate structure is defined by a semiconductor material layer. and wherein one or more of the semiconductor material layer or the waveguiding material layer is subject to ion implantation to modify a silicon crystal structure of the one or more of the semiconductor material layer or the waveguiding material layer.

12. The method of claim 1, wherein the gate structure is defined by a semiconductor material layer. and wherein one or more of the semiconductor material layer or the waveguiding material layer is subject to annealing for modification of a grain structure of the one or more of the semiconductor material layer or the waveguiding material layer.

13. The method of claim 1, wherein the forming one or more dielectric layer includes using a first layer of a first dielectric material and a second layer of a second dielectric material, wherein the method includes forming the second layer over the first layer, and wherein the method include patterning the first layer to define a spacer for a FET having the gate structure.

14. A semiconductor structure comprising:
a FET region and a trench isolation region;
a first section of a semiconductor material layer formed over a substrate within the FET region; and
a second section of the semiconductor material layer discontinuous with the first section of a semiconductor material layer, the second section formed over a trench dielectric layer of the trench isolation region, wherein the semiconductor structure includes (a) a first spacer adjacent to the first section of a semiconductor material layer, (b) a second spacer for the first section of a semiconductor material layer adjacent to the feature (a), (c) a first spacer adjacent to the second section of the semiconductor material layer, (d) a second spacer for the second section of the semiconductor material layer adjacent to the feature (c), wherein the features (a) and (c) are of a common material, and wherein the features (b) and (d) are of a common material.

15. The semiconductor structure of claim 14, wherein the trench isolation region is a deep trench isolation region.

16. The semiconductor structure of claim 14, wherein the semiconductor structure includes one or more of a source-drain halos or a source-drain extension formed within the FET region.

17. The semiconductor structure of claim 14, wherein the semiconductor structure includes (a) a first spacer adjacent to the first section of a semiconductor material layer and (b) a first spacer adjacent to the second section of the semiconductor material layer, wherein the features (a) and (b) are of a common material.

18. The semiconductor structure of claim 14, having a first dielectric layer formed over the substrate, the first dielectric layer extending within the FET region and extending within the trench isolation region.

19. The semiconductor structure of claim 14, having a first dielectric layer formed over the substrate, and a second dielectric layer formed over the first dielectric layer, the first dielectric layer and the second dielectric layer extending within the FET region and extending within the trench isolation region, the first dielectric layer being formed of a first dielectric material, the second dielectric layer being formed of a second dielectric material.

20. A semiconductor structure comprising:
a FET region and a trench isolation region;
one or more field effect transistor gate structure formed over a substrate within the FET region; and
one or more photonic device formed over a trench dielectric layer of the trench isolation region, wherein the trench dielectric layer of the trench isolation region fills a trench of the trench isolation region, and wherein the trench is formed in the substrate.

21. The semiconductor structure of claim 20, wherein the one or more photonic device is a waveguide.

22. The semiconductor structure of claim 20, wherein the one or more field effect transistor gate structure is a polysilicon gate structure.

23. The semiconductor structure of claim 20, wherein the one or more photonic device includes a first waveguide of a first height and a second waveguide of a second height.

24. The semiconductor structure of claim 20, wherein the FET region includes a field effect transistor gate structure defined by a semiconductor material layer, and wherein the trench isolation region includes a photonic device defined by the semiconductor material layer.

25. The semiconductor structure of claim 20, wherein the trench is a deep trench.

26. The semiconductor structure of claim 25, wherein the semiconductor structure includes a shallow trench having a height less than a height of the deep trench, wherein the shallow trench is formed in the substrate between the FET region and the trench isolation region.

27. The semiconductor structure of claim 26, wherein the deep trench has a height of at least two times a height of the shallow trench.

28. The semiconductor structure of claim 25, wherein the deep trench has a height of more than 500 nm.

29. The semiconductor structure of claim 20, wherein the trench isolation region is delimited by a first vertical plane that delimits a first end of a trench and an opposing second vertical plane that delimits a second end of the trench, the second end horizontally spaced from the first end, wherein the trench dielectric layer fills the trench, wherein a photonic device is disposed within the trench isolation region so that each of the first vertical plane and the opposing second vertical plane are non-intersecting with the photonic device.

30. A semiconductor structure comprising:
a FET region and a trench isolation region;
a first section of a semiconductor material layer formed over a substrate within the FET region;
a second section of the semiconductor material layer discontinuous with the first section of a semiconductor material layer, the second section formed over a trench dielectric layer of the trench isolation region; and a first dielectric layer formed over the substrate, the first dielectric layer extending within the FET region and extending within the trench isolation region, the semiconductor structure having a waveguiding material layer extending within the FET region and within the trench isolation region, the waveguiding material layer having a first section vertically under which the first dielectric layer is present and a second section vertically under which the dielectric layer is absent.

31. A semiconductor structure comprising:

a FET region and a trench isolation region;

a first section of a semiconductor material layer formed over a substrate within the FET region;

a second section of the semiconductor material layer discontinuous with the first section of a semiconductor material layer, the second section formed over a trench dielectric layer of the trench isolation region; and a first material dielectric layer formed over the substrate, the first dielectric layer extending within the FET region and extending within the trench isolation region, the first dielectric layer having a first section vertically under which the semiconductor material layer is present and a second section vertically under which the semiconductor material layer is absent.

32. A semiconductor structure comprising:

a FET region and a trench isolation region;

a first section of a semiconductor material layer formed over a substrate within the FET region;

a second section of the semiconductor material layer discontinuous with the first section of a semiconductor material layer, the second section formed over a trench dielectric layer of the trench isolation region; and a first dielectric layer formed over the substrate, the first dielectric layer extending within the FET region and extending within the trench isolation region, the trench isolation region having a trench dielectric layer formed within a trench, wherein the trench dielectric layer has a first section vertically above which the first dielectric layer is present and a second section vertically above which the first dielectric layer is absent.

33. A semiconductor structure comprising:

a FET region and a trench isolation region;

one or more field effect transistor gate structure formed over a substrate within the FET region;

one or more photonic device formed over a trench dielectric layer of the trench isolation region, wherein the trench dielectric layer of the trench isolation region fills a trench of the trench isolation region, and wherein the trench is formed in the substrate; and wherein the trench isolation region is delimited by a first vertical plane that delimits a first end of a trench and an opposing second vertical plane that delimits a second end of the trench, the second end horizontally spaced from the first end, wherein the trench dielectric layer fills the trench, wherein a photonic device is disposed within the trench isolation region so that each of the first vertical plane and the opposing second vertical plane are non-intersecting with the photonic device.

34. The semiconductor structure of claim 30, wherein the trench dielectric layer of the trench isolation region fills a trench of the trench isolation region, and wherein the trench is formed in the substrate.

* * * * *